(12) United States Patent
Inaba

(10) Patent No.: US 10,325,638 B2
(45) Date of Patent: Jun. 18, 2019

(54) MAGNETIC STORAGE DEVICE WITH VOLTAGE GENERATOR THAT VARIES VOLTAGES ACCORDING TO TEMPERATURE

(71) Applicant: TOSHIBA MEMORY CORPORATION, Minato-ku, Tokyo (JP)

(72) Inventor: Tsuneo Inaba, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/459,797

(22) Filed: Mar. 15, 2017

(65) Prior Publication Data
US 2018/0075890 A1 Mar. 15, 2018

Related U.S. Application Data

(60) Provisional application No. 62/394,161, filed on Sep. 13, 2016.

(51) Int. Cl.
G11C 7/04 (2006.01)
G11C 11/16 (2006.01)
G11C 7/10 (2006.01)

(52) U.S. Cl.
CPC ............ *G11C 11/161* (2013.01); *G11C 7/04* (2013.01); *G11C 7/1096* (2013.01); *G11C 11/1655* (2013.01); *G11C 11/1675* (2013.01); *G11C 11/1693* (2013.01); *G11C 11/1697* (2013.01)

(58) Field of Classification Search
CPC ............ G11C 11/161; G11C 11/1693; G11C 11/1697; G11C 11/1675; G11C 11/1655; G11C 7/1096; G11C 7/04; G11C 2211/5614
See application file for complete search history.

(56) References Cited

U.S. PATENT DOCUMENTS

| 6,982,916 | B2 | 1/2006 | Tsang | |
|---|---|---|---|---|
| 7,719,082 | B2 | 5/2010 | Aratani et al. | |
| 9,166,499 | B2 * | 10/2015 | Suzuki | H02M 1/08 |
| 9,245,609 | B2 | 1/2016 | Aoki | |
| 2010/0103726 | A1 * | 4/2010 | Bae | G11C 5/143 |
| | | | | 365/163 |
| 2010/0208515 | A1 | 8/2010 | Aoki et al. | |
| 2014/0157065 | A1 | 6/2014 | Ong | |
| 2017/0242632 | A1 * | 8/2017 | Cho | G06F 3/061 |

FOREIGN PATENT DOCUMENTS

JP 2013242960 A 12/2013

* cited by examiner

*Primary Examiner* — Harry W Byrne
*Assistant Examiner* — Sultana Begum
(74) *Attorney, Agent, or Firm* — Holtz, Holtz & Volek PC

(57) ABSTRACT

According to an embodiment, a magnetic storage device includes a memory cell including a magnetoresistive effect element including a storage layer and a reference layer; first and second line electrically coupled to the magnetoresistive effect element; and a write driver. The write driver supplies a first voltage to the first line in a first write operation in which a first resistance value of the magnetoresistive effect element is changed to a second resistance value smaller than the first resistance value, and supplies a second voltage different from the first voltage to the second line in a second write operation in which the second resistance value of the magnetoresistive effect element is changed to the first resistance value.

11 Claims, 18 Drawing Sheets

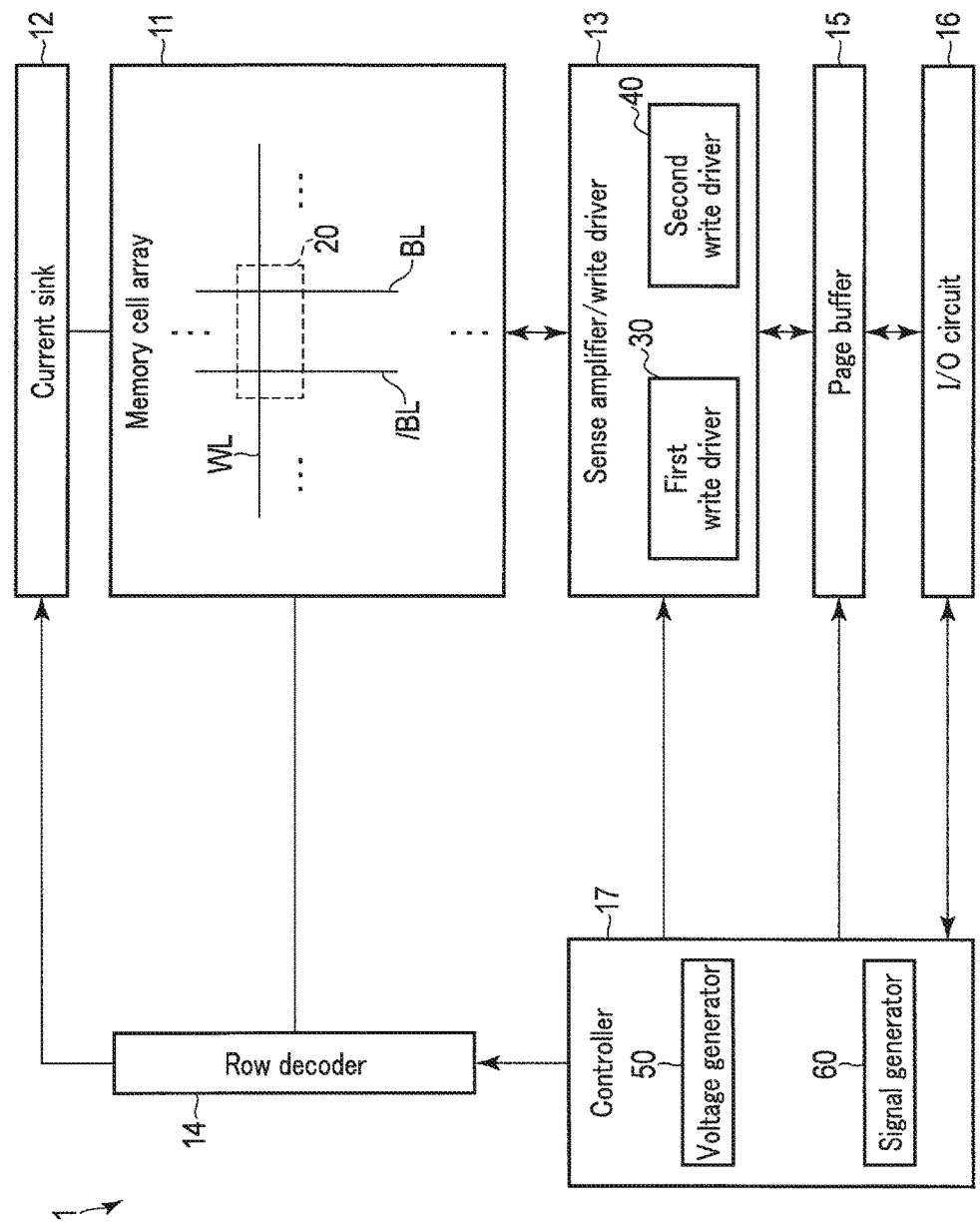
F I G. 1

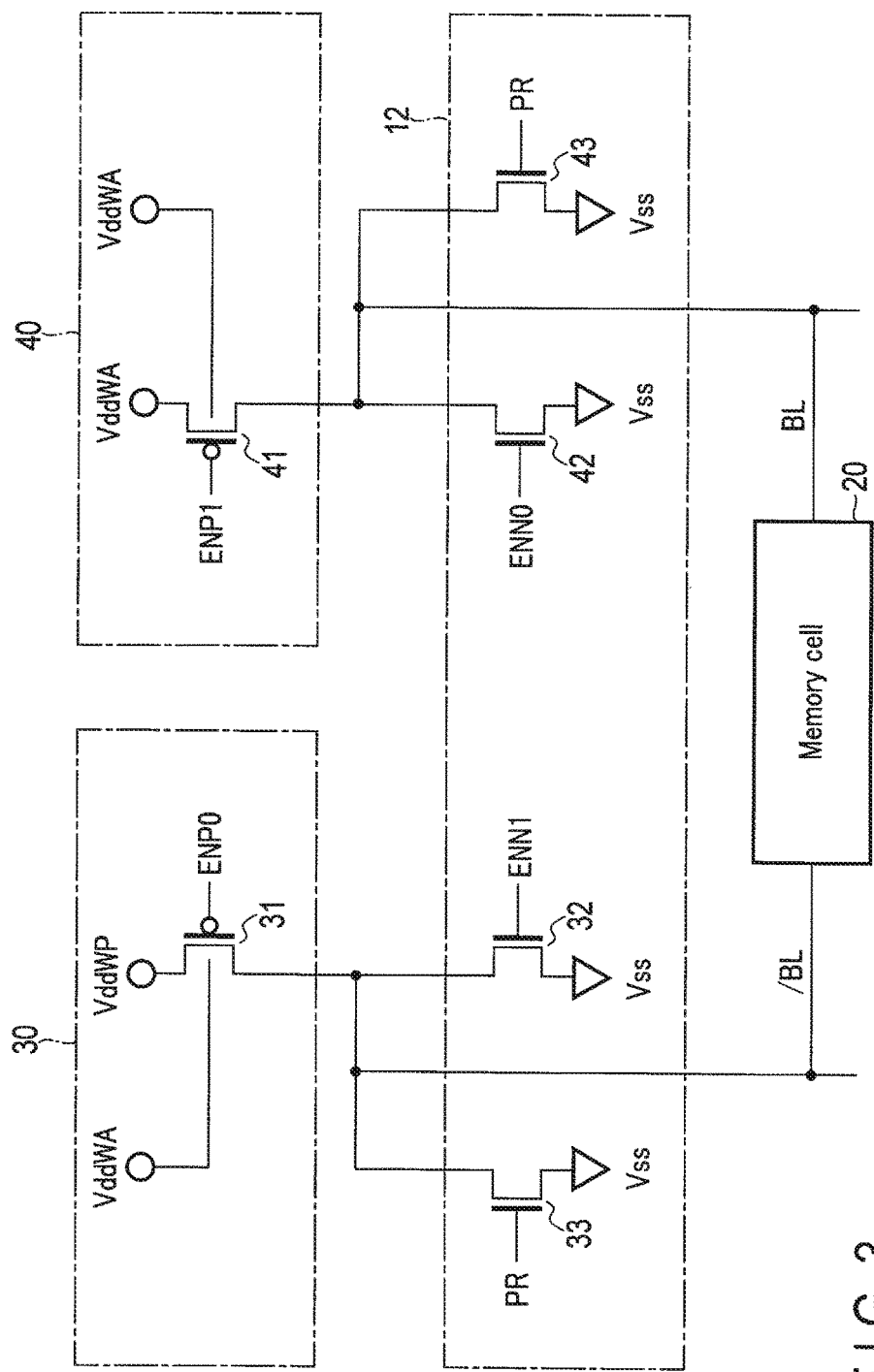
F I G. 3

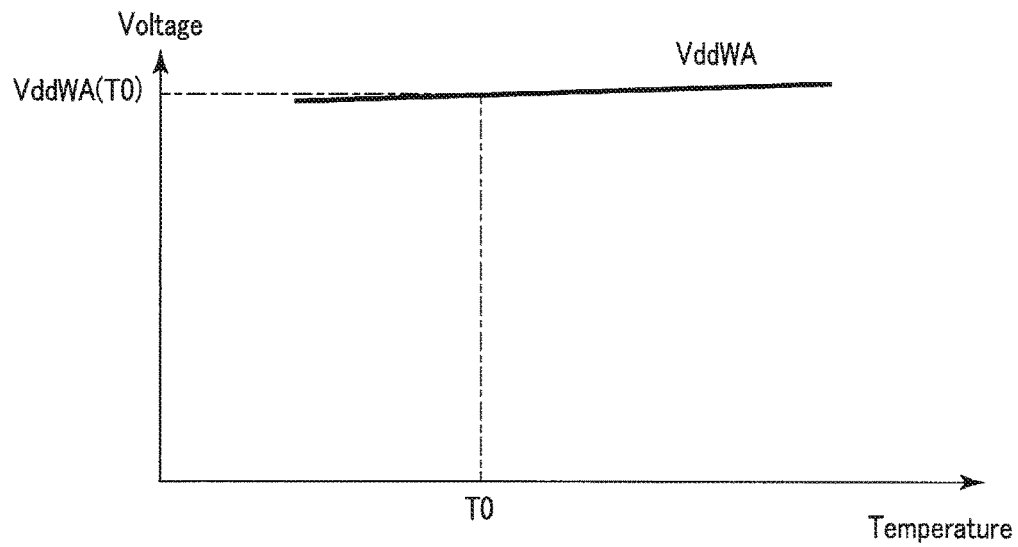
F I G. 6
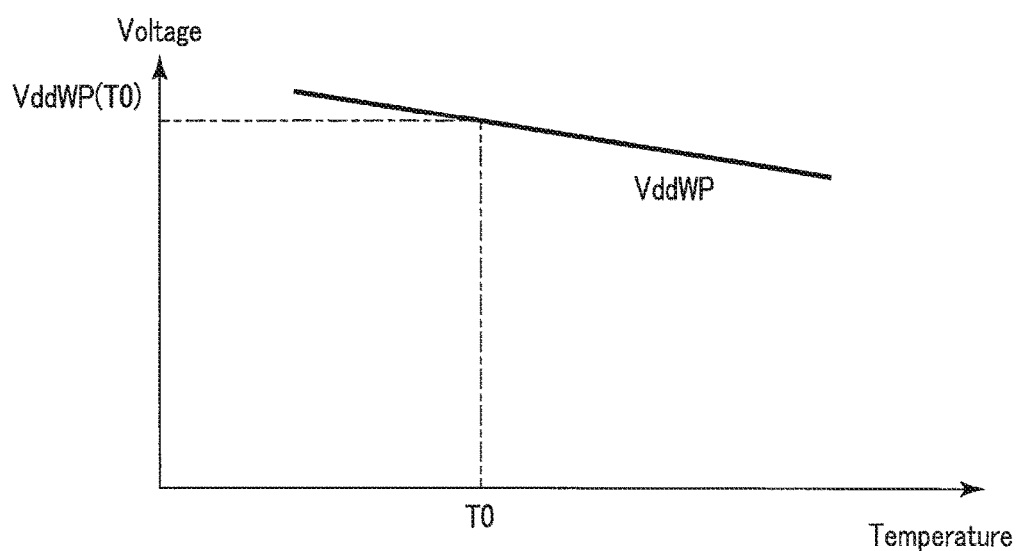
F I G. 7

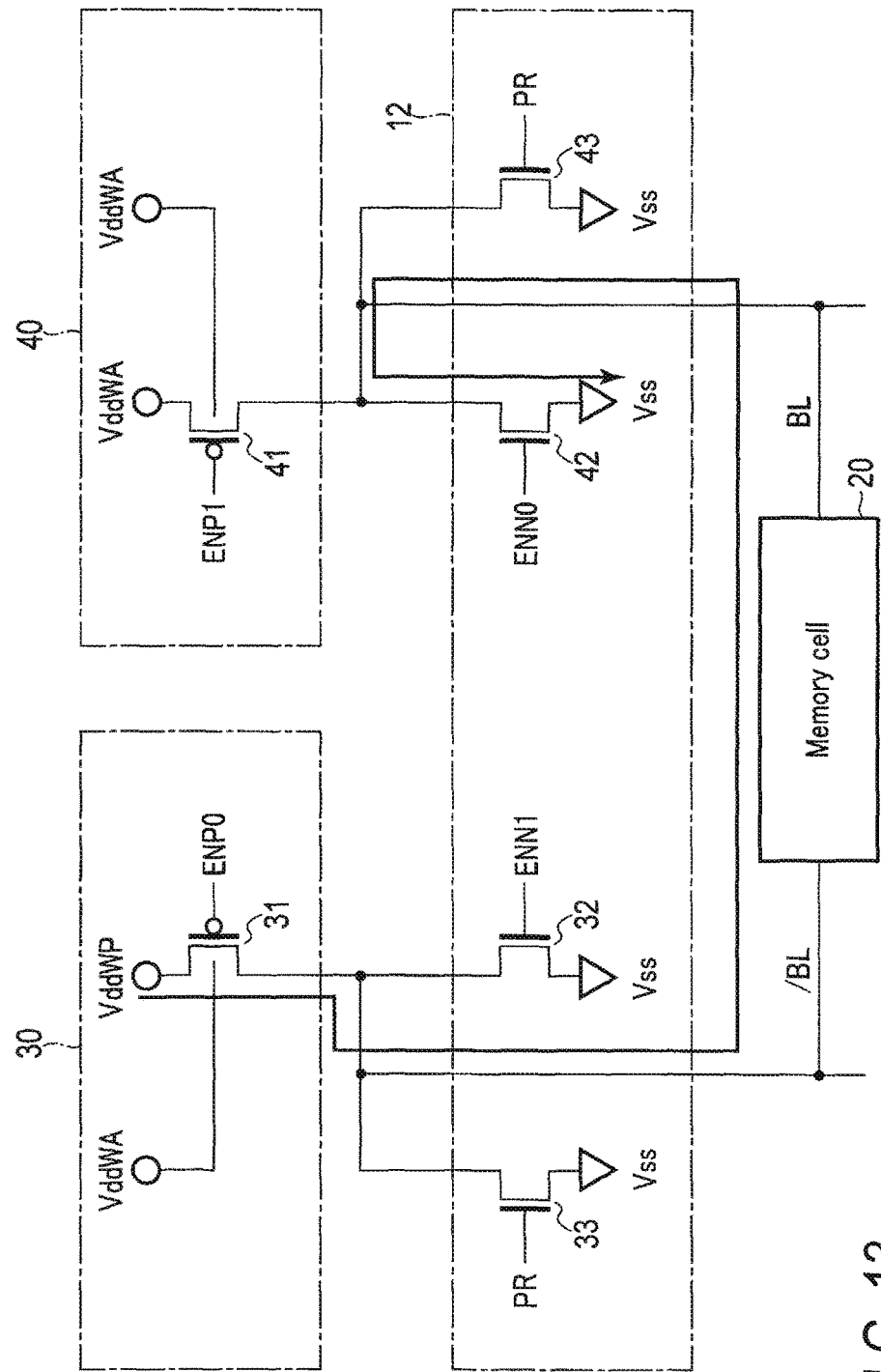
F I G. 13

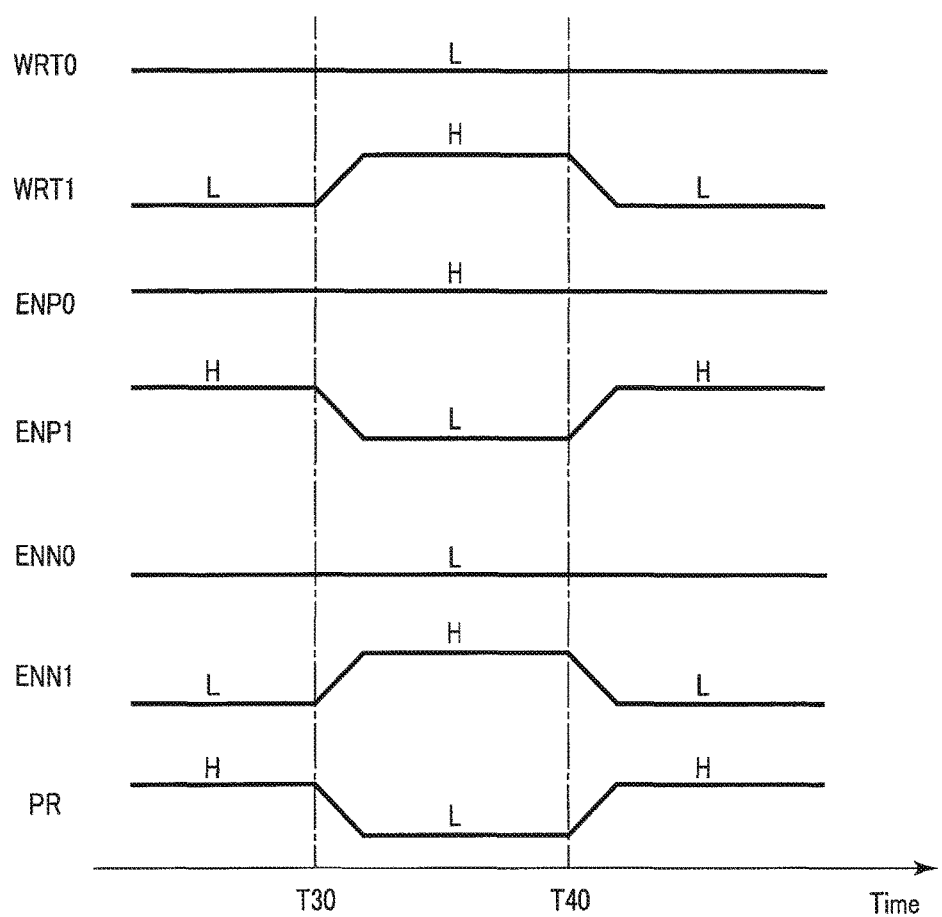
F I G. 14

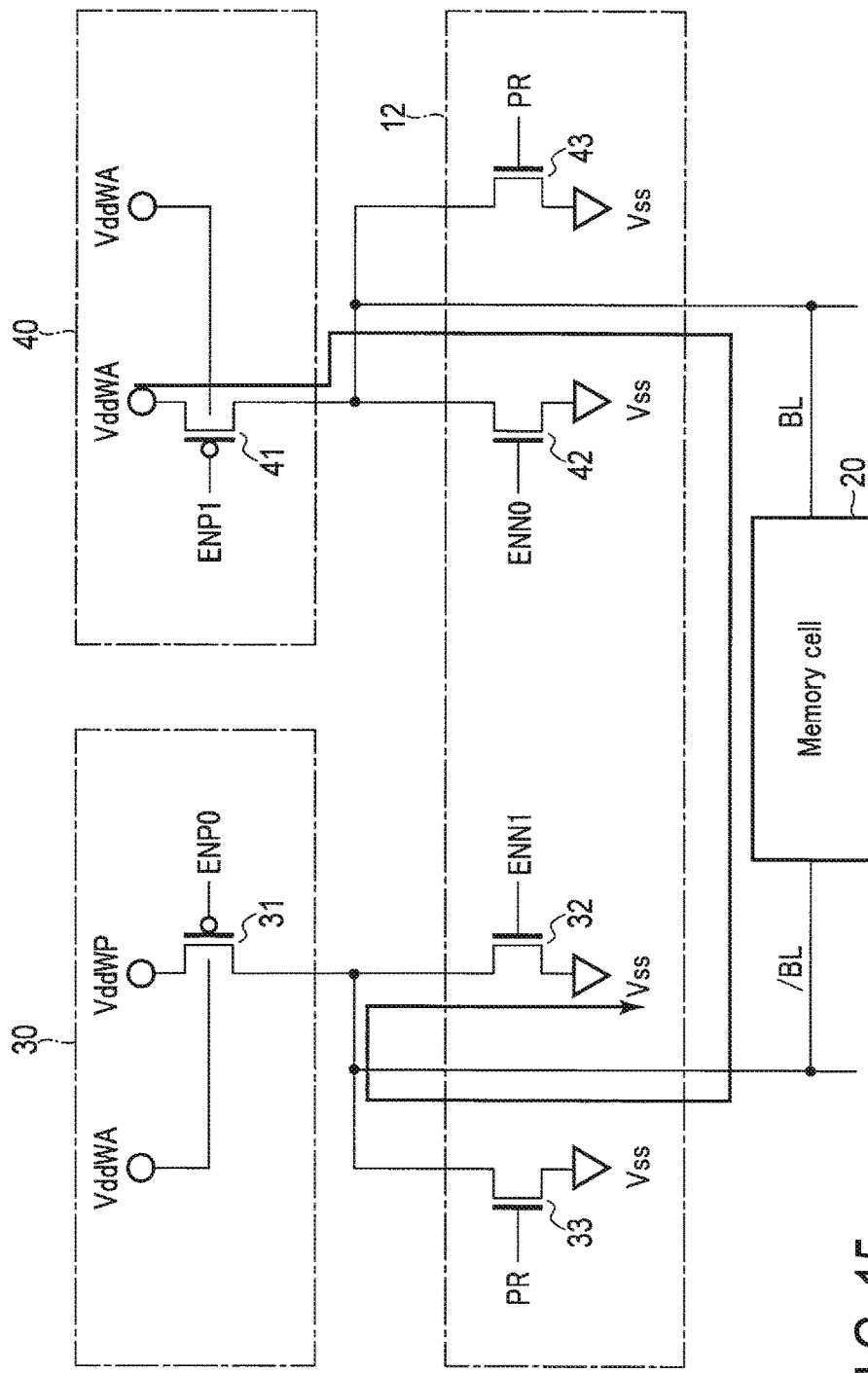
F I G. 15

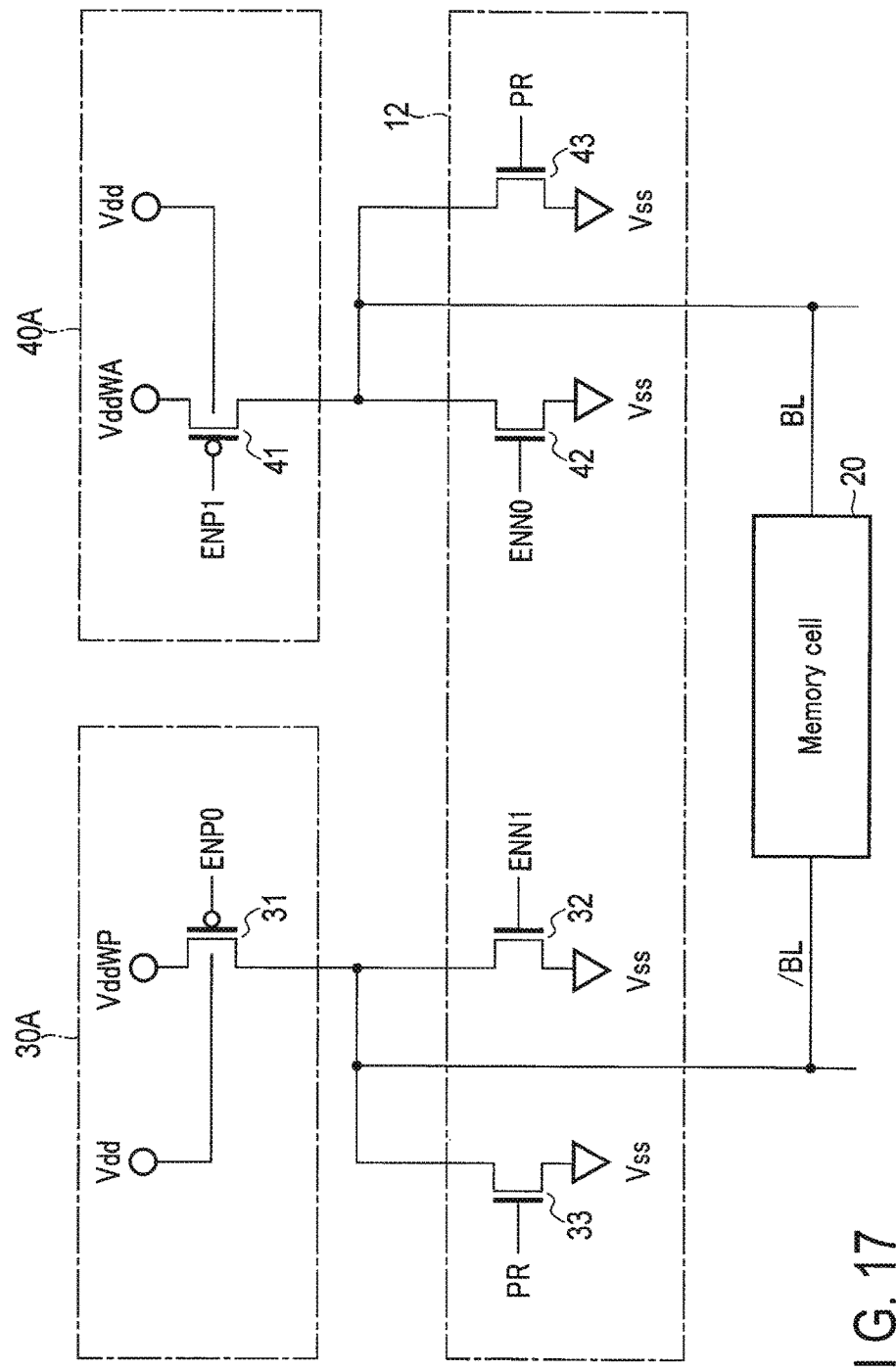
F I G. 17

MAGNETIC STORAGE DEVICE WITH VOLTAGE GENERATOR THAT VARIES VOLTAGES ACCORDING TO TEMPERATURE

CROSS-REFERENCE TO RELATED APPLICATIONS

This application claims the benefit of U.S. Provisional Application No. 62/394,161, filed. Sept. 13, 2016, the entire contents of which are incorporated herein by reference.

FIELD

Embodiments described herein relate generally to a magnetic storage device.

BACKGROUND

As storage devices included in a memory system, magnetic storage devices having resistive storage elements are known.

As semiconductor storage device having resistive storage elements, MRAM (Magnetoresistive Random Access Memory), ReRAM (Resistive Random Access Memory), PCRAM (Phase-Change Random Access Memory), and the like are known.

BRIEF DESCRIPTION OF THE DRAWINGS

FIG. 1 is a block diagram showing a configuration of a magnetic storage device according to a first embodiment;

FIG. 3 is a circuit diagram showing couplings to write drivers, a current sink, and a memory cell array in the magnetic storage device according to the first embodiment;

FIG. 6 is a diagram illustrating a temperature coefficient of a voltage during write of data "1" in the magnetic storage device according to the first embodiment;

FIG. 7 is a diagram illustrating a temperature coefficient of a voltage during write of data "0" in the magnetic storage device according to the first embodiment;

FIG. 13 is a timing chart illustrating the write operation during write of data "0" in the magnetic storage device according to the first embodiment;

FIG. 14 is a timing chart illustrating a write operation during write of data "1" in the magnetic storage device according to the first embodiment;

FIG. 15 is a timing chart illustrating the write operation during write of data "1" in the magnetic storage device according to the first embodiment;

FIG. 17 is a circuit diagram showing couplings to write drivers, a current sink, and a memory cell array in a magnetic storage device according to a second embodiment;

DETAILED DESCRIPTION

Figure 2:
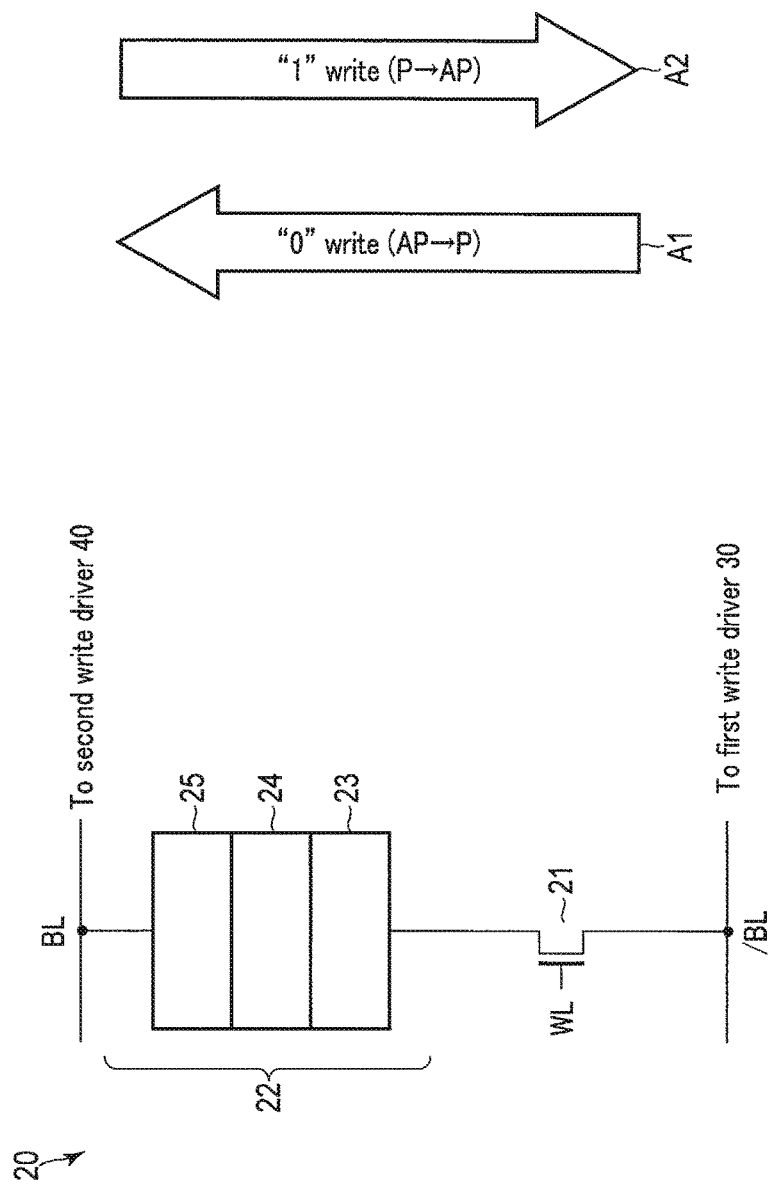
FIG. 2 is a schematic diagram illustrating a configuration of a memory cell in the magnetic storage device according to the first embodiment.

In general, according to one embodiment, a magnetic storage device includes a memory cell including a magnetoresistive effect element; a first line electrically coupled to a first terminal of the magnetoresistive effect element; a second line electrically coupled to a second terminal of the magnetoresistive effect element; and a write driver. The write driver supplies a first voltage to the first line in a first write operation in which a first resistance value of the magnetoresistive effect element is changed to a second resistance value smaller than the first resistance value, and supplies a second voltage different from the first voltage to the second line in a second write operation in which the second resistance value of the magnetoresistive effect element is changed to the first resistance value.

Embodiments will be described below with reference to the drawings. Components having substantially the same functions and configurations are hereinafter denoted by the same reference numerals. Duplicate descriptions are given only when needed. The embodiments disclosed below illustrate apparatuses and methods intended to realize the technical concepts of the embodiments. The technical concepts of the embodiments are not intended to limit the materials, shapes, structures, arrangements, and the like of components to those described below. Various modifications may be made to the technical concepts of the embodiments within the scope of claims.

As an example of a semiconductor storage device having resistive storage elements, a magnetoresistive random access memory (MRAM) will be described which includes magnetoresistive elements as resistive storage elements.

1. First Embodiment

A magnetic storage device according to a first embodiment will be described.

1.1 Configuration

First, a configuration of the magnetic storage device according to the first embodiment will be described.

1.1.1 Configuration of the Magnetic Storage Device

A magnetic storage device according to a first embodiment is, for example, a perpendicular magnetic storage device including magnetoresistive (MTJ: Magnetic Tunnel Junction) elements as resistive storage elements.

FIG. 1 is a block diagram showing a configuration of a magnetic storage device 1 according to a first embodiment. As shown in FIG. 1, the magnetic storage device 1 comprises a memory cell array 11, a current sink 12, a sense amplifier and write driver (SA/WD) 13, a row decoder 14, a page buffer 15, an I/O circuit 16, and a controller 17.

The memory cell array 11 comprises a plurality of memory cells 20 associated with rows and columns. The memory cells 20 in the same row are coupled to the same word line WL. Opposite ends of a set of the memory cells 20 in the same column are coupled to the same bit line BL and the same source line /BL.

The current sink 12 is coupled to the bit lines BL and the source lines/BL The current sink 12 sets the relevant bit lines BL or source lines/BL to a ground potential during operations such as data write and read.

The SA/WD 13 is coupled to the bit lines BL and the source lines/BL. The SA/WD 13 supplies a current to an operation target memory cell 20 via the corresponding bit line BL and source lines/BLto write data to the memory cell 20. The SA/WD 13 supplies a current to the operation target memory cell 20 via the corresponding bit line BL and source lines/BLto read data from the memory cell 20. More specifically, the SA/WD 13 includes a first write driver 30 and a second write driver 40. The first write driver 30 and the second write driver 40 in the SA/WD 13 write data to the memory cell 20. A sense amplifier in the SA/WD 13 reads data from the memory cell 20. The data write executed by the first write driver 30 and the second write driver 40 will be described below in detail.

The row decoder 14 is coupled to the memory cell array 11 via word lines WL. The row decoder 14 decodes a row address designating a row direction in the memory cell array 11. The row decoder 14 selects the word line WL in accordance with a decode result, and applies a voltage needed for an operation such as data write or read to the selected word line WL.

The page buffer 15 temporarily holds data to be written into the memory cell array 11 and data read from the memory cell array 11, in data units referred to as pages.

The I/O circuit 16 transmits various signals received from outside the magnetic storage device 1, to the controller 17 and the page buffer 15. The I/O circuit 16 transmits various pieces of information from the controller 17 and the page buffer 15 to the outside of the magnetic storage device 1.

The controller 17 is coupled to the current sink 12, the SA/WD 13, the row decoder 14, the page buffer 15, and the I/O circuit 16. The controller 17 controls the current sink 12, the SA/WD 13, the row decoder 14, and the page buffer 15 in accordance with various signals received from outside the magnetic storage device 1 by the I/O circuit 16. Specifically, for example, the controller 17 includes a voltage generator 50 and a signal generator 60. The voltage generator 50 and the signal generator 60 each generate a write voltage and a control signal based on a write signal received from outside to supply the generated write voltage and the generated control signal to the SA/WD 13. The voltage generator 50 and the signal generator 60 will be described below.

1.1.2 Configuration of the Memory Cell

Now, a configuration of the memory cell in the magnetic storage device according to the first embodiment will be described using FIG. 2. FIG. 2 is a schematic diagram illustrating the configuration of the memory cell 20 in the magnetic storage device 1 according to the first embodiment.

As shown in FIG. 2, the memory cell 20 includes, for example, a select transistor 21 and a magnetoresistive element 22. The select transistor 21 is provided to serve as a switch which controllably supplies a current or stops the supply when data is written to or read from the magnetoresistive element 22. The magnetoresistive element 22 includes a plurality of films laminated together so that a current is passed through the magnetoresistive element 22 perpendicularly to film surfaces to switch a resistance value between a low resistance state and a high resistance state. The magnetoresistive element 22 functions as a resistive storage element such that data can be written to the magnetoresistive element 22, held therein in a nonvolatile manner, and read therefrom, in accordance with changes in the resistance state of the magnetoresistive element 22.

A gate of the select transistor 21 is coupled to the corresponding word line WL. One of a source or a drain of the select transistor 21 is connected to the corresponding source line/BL. The other of the source and drain of the select transistor 21 is electrically connected to a first terminal of the magnetoresistive element 22. Each word line WL is, for example, electrically coupled in common to gates of the select transistors (not shown in the drawings) in the other memory cells arranged in the row direction in the memory cell array 11 The word lines WL are, for example, arranged in a column direction in the memory cell array 11. Each source lines/BL extends in the column direction in the memory cell array 11, and is, for example, electrically coupled in common to second terminals of the select transistors (not shown in the drawings) in the other memory cells arranged in the column direction in the memory cell array 11. The source lines/BL are electrically coupled to the first write driver 30.

A second terminal of the magnetoresistive element 22 is electrically coupled to the corresponding bit line BL. Each bit line BL extends in the column direction in the memory cell array 11, and is, for example, coupled in common to second terminals of the magnetoresistive element 22 (not shown in the drawings) in the other memory cells 20 arranged in the column direction in the memory cell array 11. The bit lines BL are electrically coupled to the second write driver 40. The bit lines BL and the source lines/BL are, for example, arranged in the row direction in the memory cell array 11.

1.1.3 Configuration of the Magnetoresistive Element

Now, the magnetoresistive element in the magnetic storage device according to the first embodiment will be described using FIG. 2 again.

The magnetoresistive element 22 comprises a storage layer 23, a tunnel barrier layer 24, and a reference layer 25. The magnetoresistive element 22 comprises the storage layer 23, the tunnel barrier layer 24, and the reference layer 25 sequentially laminated together. The magnetoresistive element 22 is a vertical magnetization-type MTJ element in which magnetization orientations in the storage layer 23 and the reference layer 25 are each perpendicular to the film surfaces.

The storage layer 23 is a ferromagnetic layer having an axis of easy magnetization in a direction perpendicular to the film surfaces, and contains, for example, cobalt iron boron (CoFeB) or iron boride (FeB). The storage layer 23 has a magnetization orientation extending either toward the select transistor 21 or toward the reference layer 25. The magnetization orientation in the storage layer 23 is set to be reversed more easily than the magnetization orientation in the reference layer 25.

The tunnel barrier layer 24 is a nonmagnetic insulating film and contains, for example, magnesium oxide (MgO).

The reference layer 25 is a ferromagnetic layer having an axis of easy magnetization in the direction perpendicular to the film surfaces, and contains, for example, cobalt platinum (CoPt), cobalt nickel (CoNi), or cobalt palladium (CoPd). The magnetization orientation in the reference layer 25 is fixed. "The magnetization orientation is fixed" means that the magnetization orientation is not varied by a current with a magnitude which allows the magnetization orientation in the storage layer 23 to be reversed. The storage layer 23, the tunnel barrier layer 24, and the reference layer 25 constitute a magnetic tunnel junction.

The first embodiment adopts a spin injection write scheme in which a write current is passed directly through the magnetoresistive element 22 as described above such that the write current controls the magnetization orientation in the storage layer 23. The magnetoresistive element 22 can be set either to the low resistance state or to the high resistance state depending on whether a relative relation between the magnetization orientations in the storage layer 23 and in the reference layer 25 is parallel or antiparallel.

When the write current is passed through the magnetoresistive element 22 in the direction of arrow A1 in FIG. 2, that is, from the storage layer 23 toward the reference layer 25, the relative relation between the magnetization orientations in the storage layer 23 and in the reference layer 25 is parallel. In the parallel state, the magnetoresistive element 22 has a low resistance value and is set to the low resistance state. The low resistance state is referred to as the "P (Parallel) state" and is defined as the state of data "0".

When the write current is passed through the magnetoresistive element 22 in the direction of arrow A2 in FIG. 2, that is, from the reference layer 25 toward the storage layer 23, the relative relation between the magnetization orientations in the storage layer 23 and in the reference layer 25 is antiparallel. In the antiparallel state, the magnetoresistive element 22 has a large resistance value and is set to the high resistance state. The high resistance state is referred to as the "AP (Anti-Parallel) state" and is defined as the state of data "1".

The description below is based on the above-described data defining method. However the manner of defining data "1" and data "0" is not limited to the above-described example. For example, the P state may be defined as data "1", whereas the AP state may be defined as data "0".

1.1.4 Configuration of the Write Driver

Now, a configuration of the write driver in the magnetic storage device according to the first embodiment will be described. FIG. 3 is a circuit diagram showing couplings to the write drivers, the current sink, and the memory cell in the magnetic storage device according to the first embodiment. FIG. 3 shows a configuration which allows independent voltages to be supplied to the magnetoresistive element 22 during the write of data "0" and during the write of data. "1".

As shown in FIG. 3, the first write driver 30 is electrically coupled to a first terminal of the memory cell 20 via the source lines/BL. The second write driver 40 is electrically coupled to a second terminal of the memory cell 20 via the bit lines BL.

The first write driver 30 is a driver to which a voltage used to drive the write current is supplied when data "0" is written to any of the memory cells 20 in the memory cell array 11. The first write driver 30 includes p-channel MOS transistors 31. The current sink 12 includes n-channel MOS transistors 32 and 33. The p-channel MOS transistors have the same size and the same voltage-current characteristics and the n-channel MOS transistors have the same size and the same voltage-current characteristics, unless the p- or n-channel MOS transistors are distinguished from one another. In the description below, the p- and n-channel MOS transistors are simply referred to as transistors unless the p-channel MOS transistors are distinguished from the n-channel MOS transistors.

A signal ENP0 is input to a gate of each transistor 31. A voltage VddWA is supplied to a back gate of the transistor 31. A voltage VddWP is supplied to a first terminal of the transistor 31. A second terminal of the transistor 31 is electrically coupled to the corresponding source line/BL. The voltage VddWP drives the write current when data "0" is written. The voltage VddWA drives the write current when data "1" is written. The voltage VddWP is generated independently of the voltage VddWA and is, for example, lower than the voltage VddWA. The voltage VddWP may have a value equal to or larger than the value of the voltage VddWA.

A signal ENN1 is input to a gate of each transistor 32. A first terminal of the transistor 32 is electrically coupled to the corresponding source line/BL, and a second terminal of the transistor 32 is grounded.

A signal PR is input to a gate of each transistor 33. A first terminal of the transistor 33 is electrically coupled to the corresponding source line/BL, and a second terminal of the transistor 33 is grounded.

The second write driver 40 is a driver to which a voltage used to drive the write current is supplied when data "1" is written to any of the memory cells 20 in the memory cell array 11. The second write driver 40 includes p-channel MOS transistors 41. The current sink 12 includes n-channel MOS transistors 42 and 43.

A signal ENP1 is input to a gate of each transistor 41. The voltage VddWA is supplied to a back gate of the transistor 41. A voltage VddWA is supplied to a first terminal of the transistor 41. A second terminal of the transistor 31 is electrically coupled to the corresponding bit line BL.

A signal ENN0 is input to a gate of each transistor 42. A first terminal of the transistor 42 is coupled to the corresponding bit line BL, and a second terminal of the transistor 42 is grounded.

A signal PR is input to a gate of each transistor 43. A first terminal of the transistor 43 is coupled to the corresponding bit-line BL, and a second terminal of the transistor 43 is grounded.

The voltages VddWA and VddWP and the signals ENP0, ENP1, ENN0, ENN1, and PR are, for example, generated by the controller 17 and supplied to the first write driver 30 or the second write driver 40. When the voltage VddWP is supplied to the first write driver 30, a current allowing data "0" to be written flows through the magnetoresistive element 22 in the memory cell array 11, from the first write driver 30 toward the second write driver 40. When the voltage VddWA is supplied to the second write driver 40, a current allowing data "1" to be written flows from the second write driver 40 toward the first write driver 30.

The above-described configuration allows the current flowing to the magnetoresistive element 22 to be controlled independently for the write of data "0" and for the write of data "1".

Now, temperature coefficients of the values of resistance between the write drivers according to the first embodiment will be described using FIG. 4 and FIG. 5.

Figure 4:
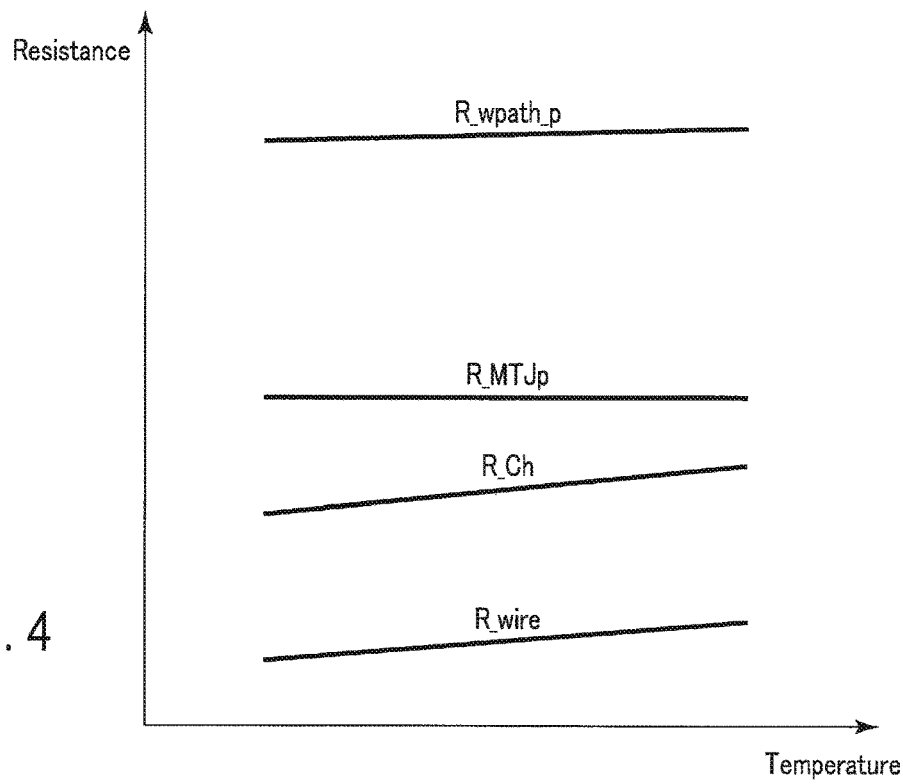
FIG. 4 is a diagram illustrating temperature coefficients of resistance values for a current path during write of data "1" in the magnetic storage device according to the first embodiment.
Figure 5:
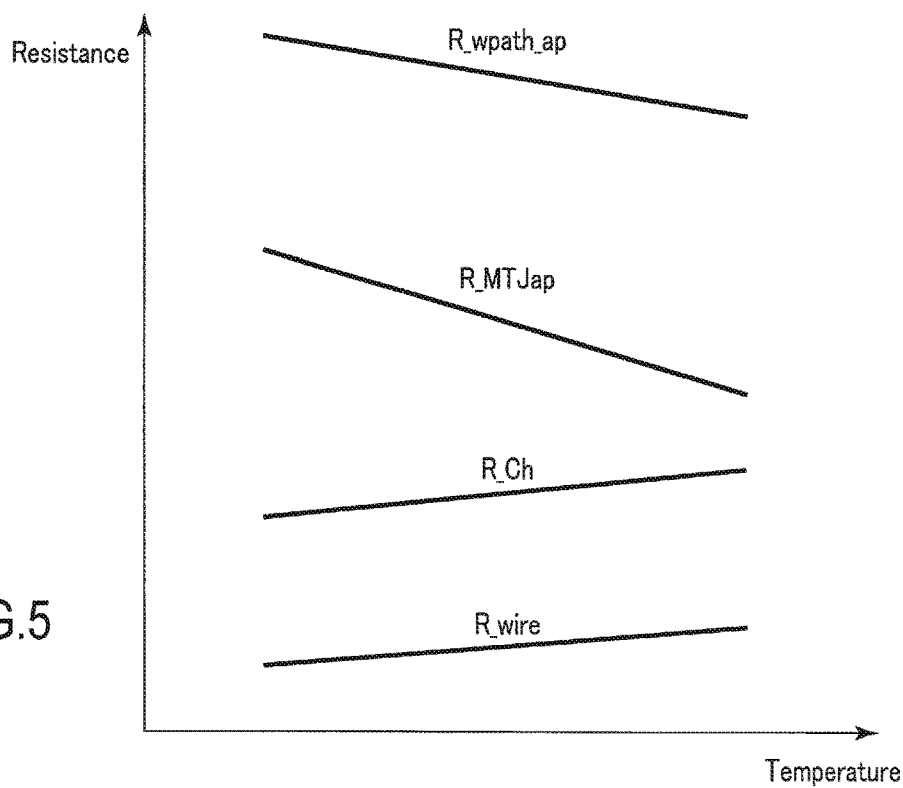
FIG. 5 is a diagram illustrating the temperature coefficients of the resistance values for the current path during write of data "0" in the magnetic storage device according to the first embodiment.

FIG. 4 and FIG. 5 are diagrams illustrating the temperature coefficients of the values of resistance between the write drivers in the magnetic storage device according to the first embodiment. FIG. 4 illustrates the temperature coefficients of resistance values for a current path during the write of data "1" within a certain temperature range. FIG. 5 illustrates the temperature coefficients of resistance values for a current path during the write of data "0" within a certain temperature range. The following description applies at least to the temperature ranges illustrated in FIG. 4 and FIG. 5.

First, the write of data "1" will be described using FIG. 4. As illustrated in FIG. 4, for the write of data "1", the current path between the first write driver 30 and the second write driver 40 is classified, for example, into a magnetoresistive element portion of the write target memory cell 20, a channel area portion, and a wire portion. These portions have different resistance values. Specifically, a combined resistance value R_wpath_p for the current path includes a resistance value R_MTJp for the magnetoresistive element portion, a resistance value R_Ch for the channel area portion, and a resistance value R_wire for the wire portion. The resistance values R_MTJp, R_Ch, and R_wire have different temperature coefficients.

The resistance value R_MTJp is the resistance value of the magnetoresistive element 22 in a state where the magnetization orientations in the storage layer 23 and in the reference layer 25 are parallel to each other. The resistance value R_MTJp has, for example, an approximately constant value regardless of a variation in temperature. The resistance value R_MTJp has a magnitude of, for example, approximately 10 kiloohms and is larger than the other resistance values R_Ch and R_wire at all temperatures.

The resistance value R_Ch is the sum of the resistance values for channel areas in the transistors such as the select transistors 21 which are present in all of the current path. The resistance value R_Ch has a positive correlation with a variation in temperature. The resistance value R_Ch has a magnitude of, for example, several kiloohms and is larger than the resistance value R_wire at all temperatures. The resistance value R_Ch varies with the temperature of the memory cell 20 by a larger amount than the other resistance values R_MTJp and R_wire. The resistance value R_wire is the sum of the resistance values of wires such as the bit lines BL and the source lines/BL which are present in the current path. The resistance value R_wire has a positive correlation with a variation in temperature. The resistance value R_wire has a magnitude of, for example, approximately several hundred ohms.

The combined resistance value R_wpath_p may be considered to be the resistance value of series coupled resistors having the resistance values R_MTJp, R_Ch, and R_wire. The combined resistance value R_wpath_p has a weak positive correlation with a variation in temperature. Alternatively, the combined resistance value R_wpath_p may be considered to be constant regardless of a variation in temperature.

Now, the write of data "1" will be described using FIG. 5.

As illustrated in FIG. 5, for the write of data "0", the current path between the first write driver 30 and the second write driver 40 is also classified, for example, into a magnetoresistive element portion, a channel area portion, and a wire portion. These portions have different resistance values. Specifically, a combined resistance value R_wpath_ap for the current path includes a resistance value R_MTJap for the magnetoresistive element portion, a resistance value R_Ch, and a resistance value R_wire. The resistance values R_MTJap, R_Ch, and R_wire have different temperature coefficients.

The resistance value R_MTJap is the resistance value of the magnetoresistive element 22 in a state where the magnetization orientations in the storage layer 23 and the reference layer 25 are antiparallel to each other. The resistance value R_MTJap is larger than the other resistance values R_Ch and R_wire at all temperatures. The resistance value R_MTJap has a negative correlation with the temperature of the memory cell 20 but is larger than the resistance value R_MTJp at any temperature.

The resistance values R_Ch and R_wire exhibit temperature coefficients similar to the corresponding temperature coefficients illustrated in FIG. 4.

The combined resistance value R_wpath_ap may be considered to be the resistance value of series coupled resistors having the resistance values R_MTJap, R_Ch, and R_wire. The combined resistance value R_wpath_ap has a strong negative correlation with a variation in temperature. That is, the amount of variation in combined resistance value R_wpath_ap with respect to the temperature has a larger absolute value than the amount of variation in the amount of variation in combined resistance value R_wpath_p with respect to the temperature.

Now, the temperature coefficients of the voltages supplied to the write drivers according to the first embodiment will be described using FIG. 6 and FIG. 7.

FIG. 6 is a diagram illustrating the temperature coefficient of the voltage supplied to the second write driver in the magnetic storage device according to the first embodiment. FIG. 6 illustrates the temperature coefficient of the voltage VddWA needed to allow a certain constant current to flow with respect to the combined resistance value R_wpath_p.

As illustrated in FIG. 6, the voltage VddWA has a weak positive correlation with the temperature similarly to the combined resistance value R_wpath_p. Alternatively, the voltage VddWA may be considered to be uncorrelated with the temperature similarly to the combined resistance value R_wpath_p.

The voltage VddWA is, for example, associated with the temperature in accordance with the following equation.

$$VddWA(T) = VddWA(T0) + Tc1(T-T0) \quad (Tc1 \geq 0)$$

In the equation, a temperature T represents any temperature, and a temperature T0 represents, for example, the temperature of an environment where the magnetic storage device 1 generally operates. For example, FIG. 6 illustrates an example in which the temperature T0 is set to 27° C. However, the temperature T0 is not limited to 27° C. but may be set to any temperature. The voltages VddWA(T) and VddWA(T0) are the values of the voltage VddWA corresponding to the temperatures T and T0. A slope Tc1 is a nonnegative constant indicative of the amount of variation in voltage VddWA with respect to the temperature T.

FIG. 7 is a diagram illustrating the temperature coefficient of the voltage supplied to the first write driver in the magnetic storage device according to the first embodiment. FIG. 7 illustrates the temperature coefficient of the voltage VddWP needed to allow a certain constant current to flow with respect to the combined resistance value R_wpath_ap.

As illustrated in FIG. 7, the voltage VddWP has a strong negative correlation with the temperature similarly to the combined resistance value R_wpath_ap. The voltage VddWP is, for example, associated with the temperature in accordance with the following equation.

$$VddWP(T) = VddWP(T0) + Tc0(T-T0) \quad (Tc0 < 0)$$

The voltages VddWP(T) and VddWP(T0) are the values of the voltage VddWA corresponding to the temperatures T and T0. A slope Tc0 is a negative constant indicative of the amount of variation in voltage VddWP with respect to the temperature T.

As described above, the slope Tc1 is set to a nonnegative value (Tc1>0), and the slope Tc0 is set to a negative value (Tc0<0). Thus, the slopes Tc1 and Tc0 have a relation Tc1≥0>Tc0. As described above, the slope Tc1 has a weak positive correlation with the temperature T, and the slope Tc0 has a strong negative correlation with the temperature T. Thus, the absolute value |Tc0| is set to be larger than the absolute value |Tc1| of the slope Tc1 (|Tc0|>|Tc1|).

1.1.5 Configuration of the Controller

Now, a configuration of the controller in the magnetic storage device according to the first embodiment will be described.

Figure 8:
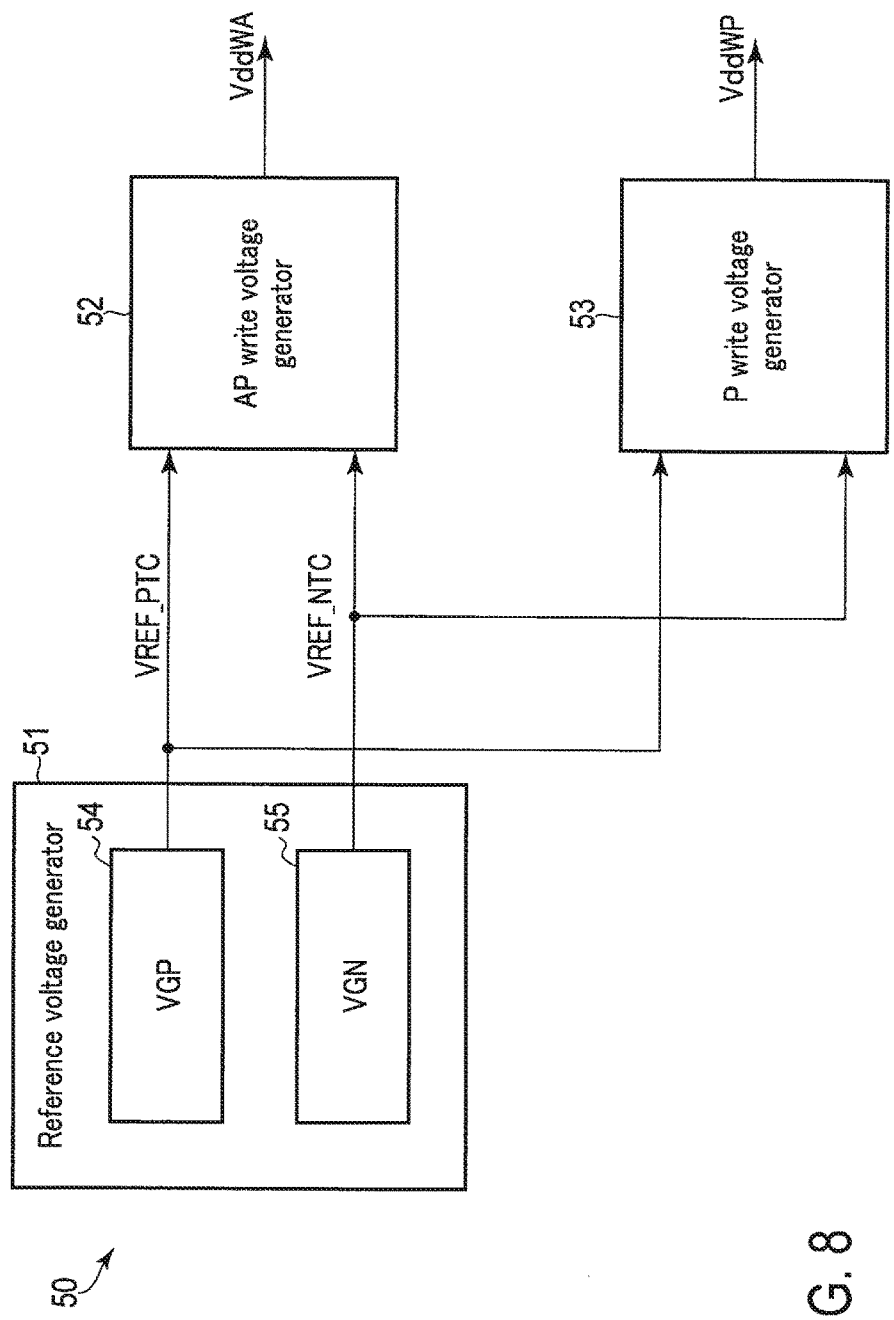
FIG. 8 is a circuit diagram showing a configuration of a voltage generator in a controller in the magnetic storage device according to the first embodiment.
Figure 9:
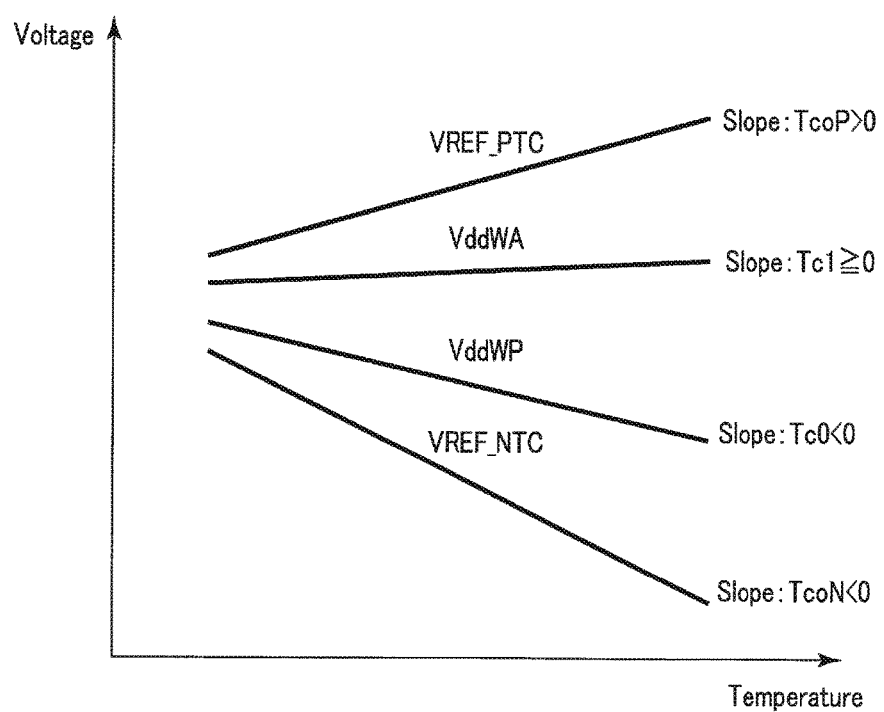
FIG. 9 is a diagram illustrating a relation among voltages generated in the voltage generator in the magnetic storage device according to the first embodiment.

First, a configuration of the voltage generator in the magnetic storage device according to the first embodiment will be described using FIG. 8 and FIG. 9. FIG. 8 is a block diagram showing the configuration of the voltage generator in the controller in the magnetic storage device according to the first embodiment. FIG. 9 is a diagram illustrating a relation among voltages generated in the voltage generator in the magnetic storage device according to the first embodiment.

As shown in FIG. 8, the voltage generator 50 includes a reference voltage generator 51, an AP write voltage generator 52, and a P write voltage generator 53.

The reference voltage generator 51 generates and supplies voltages VREF_PTC and VREF_NTC to the AP write voltage generator 52 and the P write voltage generator 53, respectively. The voltage VREF_PTC has a positive temperature coefficient. The voltage VREF_NTC has a negative temperature coefficient. The reference voltage generator 51, for example, includes a VGP (Voltage generator generating voltage with positive coefficient) 54 and a NGP (Voltage generator generating voltage with negative coefficient) 55.

The VGP 54 generates a voltage VREF_PTC, and supplies the voltage VREF_PTC to the AP write voltage generator 52 and the P write voltage generator 53. The VGN 55 generates a voltage VREF_NTC, and supplies the voltage VREF_NTC to the AP write voltage generator 52 and the P write voltage generator 53. The VGP 54 and the VGN 55 have functions to generate voltages VREF_PTC and VREF_NTC, respectively, so as to vary the values of the voltages VREF_PTC and VREF_NTC according to the temperatures of the VGP 54 and the VGN 55, respectively. The voltages VREF_PTC and VREF_NTC may be considered to be generated according to a variation in the temperature of the memory cell 20 by viewing variations in the temperatures of the VGP 54 and the VGN 55 as a variation in temperature of the memory cell 20. For example, BGR (Band-gap reference) circuits are applicable to the VGP 54 and the VGN 55. However, the VGP 54 and VGN 55 are not limited to the BGR circuits.

Upon receiving the voltages VREF_PTC and VREF_NTC from the VGP 54 and the VGN 55, respectively, the AP write voltage generator 52 generates a voltage VddWA based on the voltages VREF_PTC and VREF_NTC. The AP write voltage generator 52 supplies the generated voltage VddWA to the first write driver 30.

Upon receiving the voltages VREF_PTC and VREF_NTC from the VGP 54 and the VGN 55, respectively, the P write voltage generator 53 generates the voltage VddWP based on the voltages VREF_PTC and VREF_NTC. The P write voltage generator 53 supplies the generated voltage VddWP to the first write driver 30 and the second write driver 40.

The AP write voltage generator 52 and the P write voltage generator 53 can generate voltages VddWA and VddWP which are independent of each other by, for example, adding the voltages VREF_PTC and VREF_NTC together in different ratios.

In an example illustrated in FIG. 9, the voltages VREF_PTC, VREF_NTC, VddWA, and VddWP are generated in accordance with relations indicated by the following equations.

$$\text{VddWA} = (M1 \times \text{VREF\_PTC} + N1 \times \text{VREF\_NTC})/(M1+N1)$$

$$\text{VddWP} = (M2 \times \text{VREF\_PTC} + N2 \times \text{VREF\_NTC})/(M2+N2)$$

In the equations, the numbers M1, N1, M2, and N2 are any real numbers.

As described above, the voltage VREF_PTC has a positive temperature coefficient (for example, a slope TcoP), and the voltage VREF_NTC has a negative temperature coefficient (for example, a slope TcoN). In this case, the voltage VddWA has the slope Tc1=(M1×TcoP+N1×TcoN)/(M1+N1) as a temperature coefficient, and the voltage VddWP has the slope Tc0=(M2×TcoP+N2×TcoN)/(M2+N2) as a temperature coefficient. When the numbers M1 and N1 are set in the appropriate ratios as described above, the slope Tc1 can be adjustably set equal to or larger than 0 (Tc1≥0). When the numbers M2 and N2 are set in the appropriate ratios as described above, the slope Tc0 can be adjustably set to be negative (Tc0<0).

The numbers M1 and N1 can be set independently of the numbers M2 and N2. The numbers M1, N1, M2, and N2 may be preset or varied within a certain range. The above-described configuration allows the voltage generator 50 to generate voltages VddWP and VddWA having independent values and different temperature coefficients.

Figure 10:
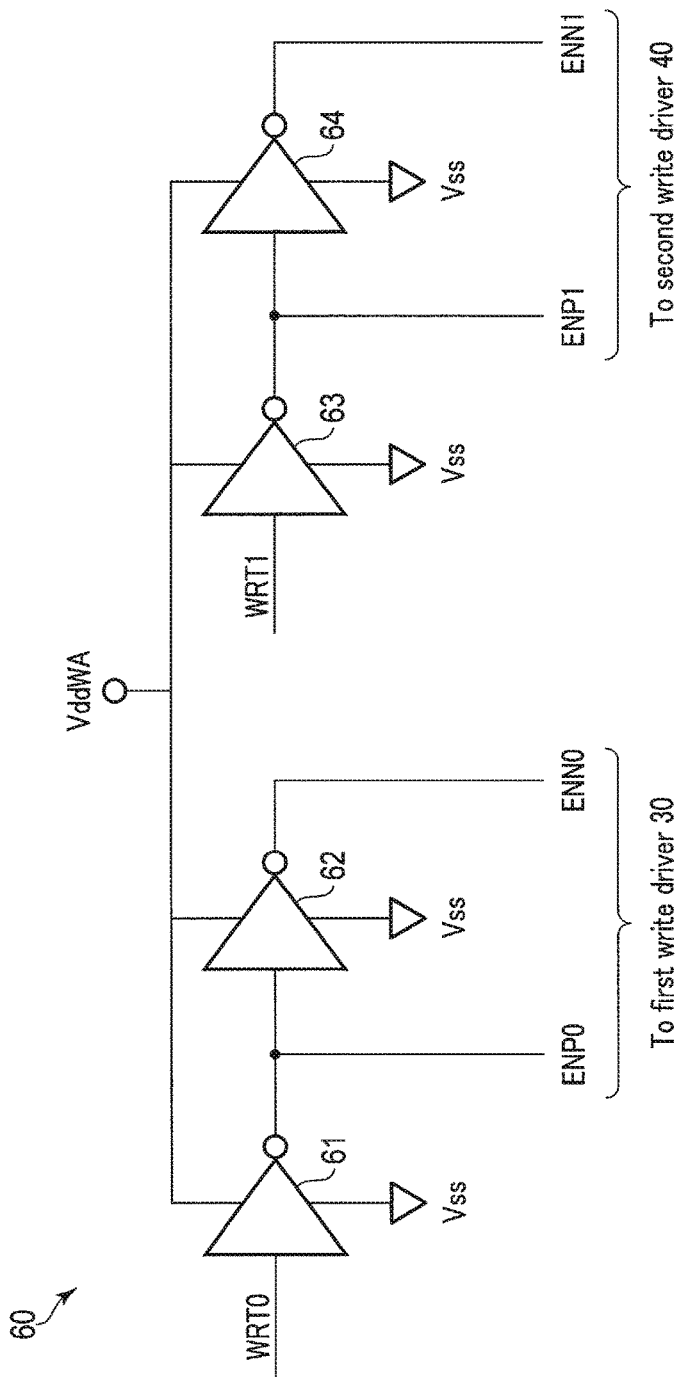
FIG. 10 is a circuit diagram showing a configuration of a signal generator in the controller in the magnetic storage device according to the first embodiment.

Now, a configuration of the signal generator in the magnetic storage device according to the first embodiment will be described using FIG. 10. FIG. 10 is a circuit diagram showing the configuration of the signal generator in the controller in the magnetic storage device according to the first embodiment.

As shown in FIG. 10, the signal generator 60 includes inverters 61, 62, 63, and 64. Each of the inverters 61 to 64 is driven using the voltage VddWA as a drive voltage. That is, each of the inverters 61 to 64 outputs high level signals with a magnitude equal to the voltage VddWA.

A signal WRT0 is input to the inverter 61. The signal WRT0 indicates write of data "0" to any of the memory cells 20 in the memory cell array 11. The signal WRT0 is, for example, transmitted from outside and input to the controller 17 via the I/O circuit 16. Upon receiving the signal WRT0, the inverter 61 generates a signal ENP0 by inverting the signal WRT0. The generated signal ENP0 is input to the inverter 62 and output to the first write driver 30.

Upon receiving the signal ENP0, the inverter 62 generates a signal ENN0 by inverting the signal ENP0. The generated signal ENN0 is output to the first write driver 30.

A signal WRT1 is input to the inverter 63. The signal WRT1 indicates write of data "0" to any of the memory cells 20 in the memory cell array 11. The signal WRT1 is, for example, transmitted from outside and input to the controller 17 via the I/O circuit 16. Upon receiving the signal WRT1, the inverter 63 generates a signal ENP1 by inverting the signal WRT1. The generated signal ENP1 is input to the inverter 64 and output to the second write driver 40.

Upon receiving the signal ENP1, the inverter 64 generates a signal ENN1 by inverting the signal ENP1. The generated signal ENN1 is output to the second write driver 40.

1.2 Operations

Now, operations of the magnetic storage device according to the first embodiment will be described.

1.2.1 Summary of the Write Operation

Figure 11:
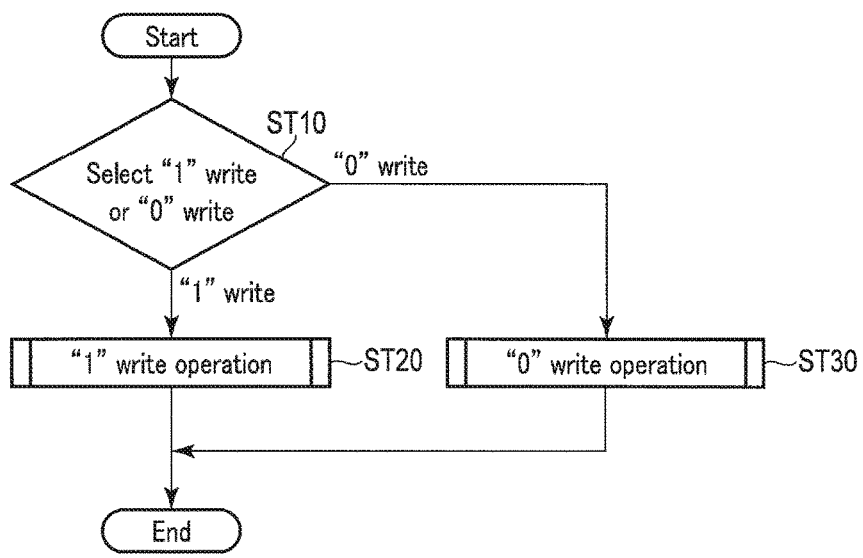
FIG. 11 is a flowchart illustrating a write operation of the magnetic storage device according to the first embodiment.

First, a summary of a write operation in the magnetic storage device according to the first embodiment will be provided. FIG. 11 is a flowchart illustrating the summary of the write operation in the magnetic storage device according to the first embodiment. First, before step ST10, the controller 17 starts supplying a write voltage to the first write driver 30 and the second write driver 40 in response to power-on. The controller 17 varies the write voltage supplied to the first write driver 30 and the second write driver 40 according to the temperature at that point in time. Specifically, the VGP 54 generates and supplies a voltage VREF_PTC uncorrelated with a variation in temperature or having a positive temperature coefficient, to the AP write voltage generator 52 and the P write voltage generator 53. The VGN 55 generates and supplies a voltage VREF_NTC having a negative temperature coefficient to the AP write voltage generator 52 and the P write voltage generator 53. The AP write voltage generator 52 and the P write voltage generator 53 generates voltages VddWA and VddWP, respectively, based on the voltages VREF_PTC and VREF_NTC. The AP write voltage generator 52 supplies the voltage VddWA to the first write driver 30 and the second write driver 40. The P write voltage generator 53 supplies the voltage VddWP to the first write driver 30.

Subsequently, in step ST10, the controller 17 receives the signal WRT0 or WRT1 indicating write of data (either data "0" or data "1"), from outside via the I/O circuit 16, as illustrated in FIG. 11, The controller 17 selectively determines whether to write data "1" or data "0" based on the received signal WRT0 or WRT1.

Specifically, for example, in step ST10, the controller 17 determines that data "1" is to be written (ST10: yes), and the process proceeds to step ST20. Upon receiving the signal WRT0, the controller 17 determines that data "0" is to be written (ST10: no), and the process proceeds to step ST30.

In step ST20, the controller 17 performs a write operation for data "1". In step ST30, the controller 17 performs a write operation for data "0".

The write operation thus ends.

Furthermore, the case was described in which the controller 17 selectively determines whether to write data "1" or data "0" based on the received signal WRT0 or WRT1. However, the controller 17, for example, may compare data previously written with data to be written. In this case, the controller 17 may perform a write operation when both data are different from each other, and the controller 17 may omit the write operation when both data are consistent.

1.2.2 Data "0" Write Operation

Figure 12:
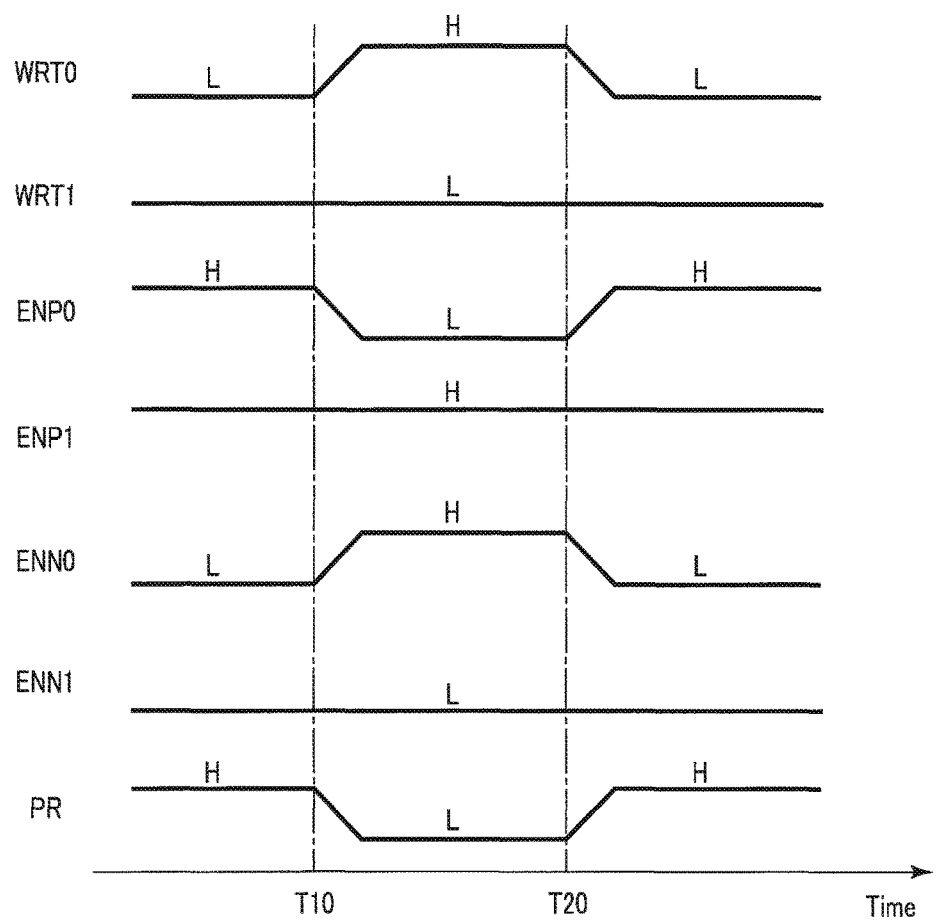
FIG. 12 is a timing chart illustrating a write operation during write of data "0" in the magnetic storage device according to the first embodiment.

Now, a write operation for data "0" in the magnetic storage device according to the first embodiment will be described. FIG. 12 is a timing chart illustrating the write operation for data "0" in the magnetic storage device according to the first embodiment. FIG. 12 particularly illustrates step ST30 included in the operations illustrated in FIG. 11, As illustrated in FIG. 12, the controller 17 receives no signal indicating write of data until time T10. Therefore, the signals WRT0 and WRT1 at an "L (Low)" level are input to the controller 17 until time T10. In response, the inverter 61 outputs the signal ENP0 at an "H (High)" level as an inverted signal of the signal WRT0. The inverter 62 outputs the signal ENN0 at the "L" level as an inverted signal of the signal ENP0. The inverter 63 outputs the signal ENP1 at the "H" level as an inverted signal of the signal WRT1. The inverter 64 outputs the signal ENN1 at the "L" level as an inverted signal of the signal ENP1. On the other hand, the signal PR is input at the "H" level. Thus, the transistors 31, 32, 41, and 42 are kept in an off state and the transistors 33 and 43 are kept in an on state until time T10. Thus, the memory cell array 11 is grounded.

At time T10, the controller 17 receives the WRT0 at the "H" level as a signal indicating write of data "0". In response, the inverter 61 outputs the signal ENP0 at the "L" level as an inverted signal of the signal WRT0. The inverter 62 outputs the signal ENN0 at the "H" level as an inverted signal of the signal ENP0. The signal WRT1 remains at the "L" level, and thus, the signals ENP1 and ENN1 remain unchanged. The signal PR is input at the "L" level. Consequently, at time T10, the transistors 31 and 42 are set to the on state, and the transistors 32, 33, 41, and 43 are set to the off state.

At time T20, the signals WRT0 and WRT1 are input at the "L" level as is the case with the period until time T10. In response, the inverters 61 and 63 output the signals ENP0 and ENP1 at the "H" level, respectively. The inverters 62 and 64 output the signals ENN0 and ENN1 at the "L" level. The signal PR is input at the "H" level. Thus, at time T20, the transistors 31, 32, 41, and 42 are set to the off state, and the transistors 33 and 43 are set to the on state. Thus, the memory cell array 11 is grounded.

FIG. 13 is a schematic diagram illustrating the write operation for data "0" in the magnetic storage device according to the first embodiment. FIG. 13 shows, with an arrow, a current path for the write current during the write of data "0".

As described above, between time T10 and time T20, the transistors 31 and 42 are in the on state, and the transistors 32, 33, 41, and 43 are in the off state. Thus, a current path is formed which has a first terminal at the first write driver 30, to which the voltage VddWP is supplied, and a second terminal at the second write driver 40, which is grounded. Therefore, through the write target magnetoresistive element 22 in the memory cell array 11, the write current for data "0" flows from the source line/BL toward the bit line BL. Then, data "0" is written to the magnetoresistive element 22.

1.2.3 Data "1" Write Operation

Now, a write operation for data "1" in the magnetic storage device according to the first embodiment will be described. FIG. 14 is a timing chart illustrating the write operation for data "1" in the magnetic storage device according to the first embodiment. FIG. 14 particularly shows step ST20 included in the operations illustrated in FIG. 11.

As illustrated in FIG. 14, the controller 17 receives no signal indicating write of data until time T30. Therefore, the signals WRT0 and WRT1 at the "L" level are input to the controller 17 until time T30. In response, the inverter 61 outputs the signal ENP0 at the "H" level as an inverted signal of the signal WRT0. The inverter 62 outputs the signal ENN0 at the "L" level as an inverted signal of the signal ENP0. The inverter 63 outputs the signal ENP1 at the "H" level as an inverted signal of the signal WRT1. The inverter 64 outputs the signal ENN1 at the "L" level as an inverted signal of the signal ENP1. On the other hand, the signal PR is input at the "H" level. Thus, the transistors 31, 32, 41, and 42 are kept in the off state and the transistors 33 and 43 are kept in the on state until time T30. Thus, the memory cell array 11 is grounded.

At time T30, the controller 17 receives the WRT1 at the "H" level as a signal indicating write of data "1". In response, the inverter 63 outputs the signal ENP1 at the "L" level as an inverted signal of the signal WRT1. The inverter 64 outputs the signal ENN1 at the "H" level as an inverted signal of the signal ENP1. The signal WRT0 remains at the "L" level, and thus, the signals ENP0 and ENN0 remain unchanged. The signal PR is input at the "L" level. Consequently, at time T30, the transistors 41 and 32 are set to the on state, and the transistors 31, 33, 42, and 43 are set to the off state.

At time T40, the signals WRT0 and WRT1 are input at the "L" level as is the case with the period until time T30. In response, the inverters 61 and 63 output the signals ENP0 and ENP1 at the "H" level, respectively. The inverters 62 and 64 output the signals ENN0 and ENN1 at the "L" level. The signal PR is input at the "H" level. Thus, at time T40, the transistors 31, 32, 41, and 42 are set to the off state, and the transistors 33 and 43 are set to the on state. Thus, the memory cell array 11 is grounded.

FIG. 15 is a schematic diagram illustrating the write operation for data "1" in the magnetic storage device according to the first embodiment. FIG. 15 shows, with an arrow, a current path for the write current during the write of data "1".

As described above, between time T30 and time T40, the transistors 41 and 32 are in the on state, and the transistors 31, 33, 42, and 43 are in the off state. Thus, a current path is formed which has a first terminal at the first write driver 30, to which the voltage VddWA is supplied, and a second terminal at the second write driver 40, which is grounded. Therefore, through the write target magnetoresistive element 22 in the memory cell array 11, the write current for data "1" flows from the bit line BL toward the source line/BL. Then, data "1" is written to the magnetoresistive element 22.

1.2.4 Write Current

Figure 16:
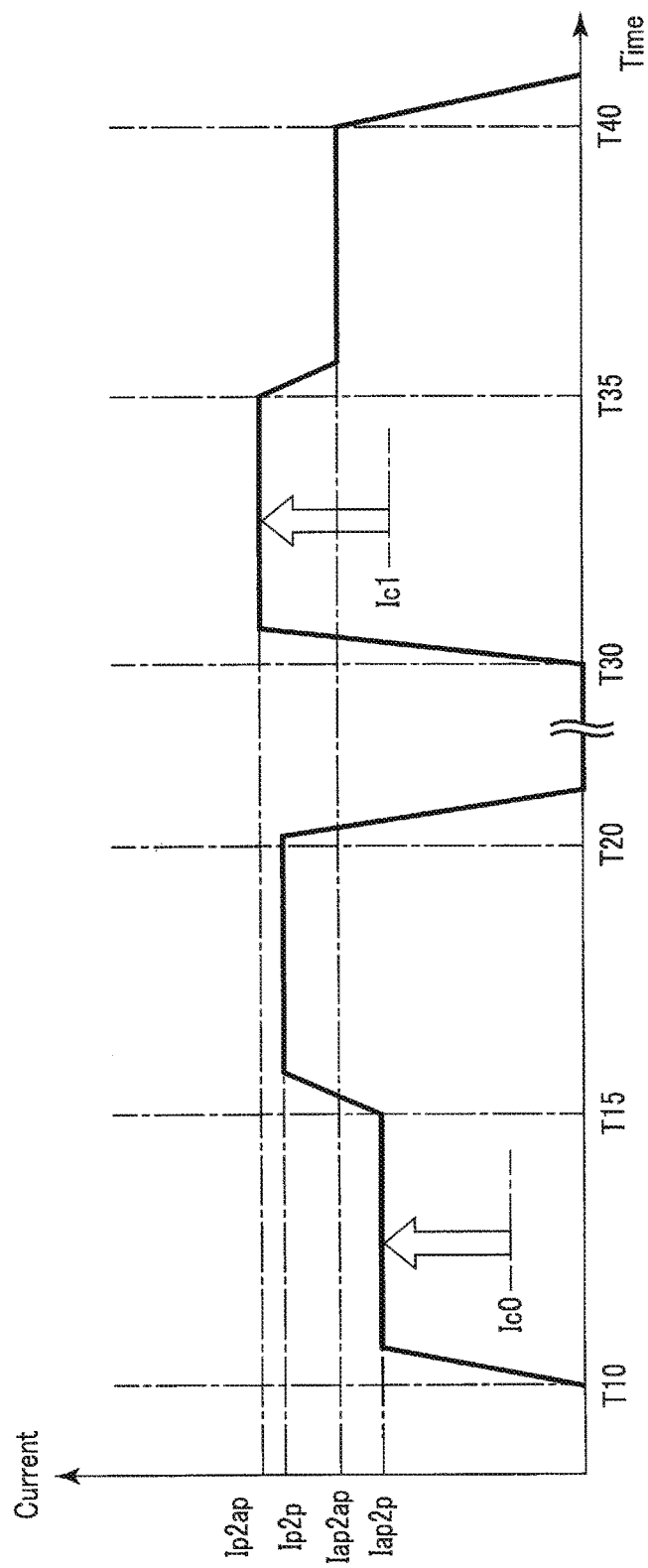
FIG. 16 is a timing chart illustrating a variation in a current flowing through a magnetoresistive element during the write operation in the magnetic storage device according to the first embodiment.

Now, the write current will be described which flows through the magnetoresistive element during the write operation in the magnetic storage device according to the first embodiment. FIG. 16 is a timing chart illustrating a variation in the write current flowing through the magnetoresistive element in the magnetic storage device according to the first embodiment. FIG. 16 illustrates a variation in current during the write of data "0" and a variation in current during the write of data "1". Time T10 and time T20 in FIG. 16 correspond to time T10 and time T20 in FIG. 12, and time T30 and time T40 in FIG. 16 correspond to time T30 and time T40 in FIG. 14.

As shown in FIG. 16, first, write of data "0" is executed between time T10 and time T20. The magnetoresistive element 22 is kept in the AP state until time T10.

At time T10, the controller 17 supplies the voltage VddWP between the first write driver 30 and the second write driver 40. A current Iap2p flows through the magnetoresistive element 22 in the AP state.

At time T15, the current Iap2p causes magnetic reversal to change the magnetoresistive element 22 from the AP state to the P state, with data "0" written to the magnetoresistive element 22. As a result, in the magnetoresistive element 22, the resistance value changes from R_MTJap to R_MTJp, and the flowing current changes from Iap2p to Ip2p.

The voltage VddWP is set so as to prevent the current Iap2p (and Ip2p) from being excessively large compared to a current Ic0 needed to cause magnetic reversal to change the magnetoresistive element 22 from the AP state to the P state.

At time T20, the controller 17 grounds the first write driver 30 and the second write driver 40. Then, no current flows through the magnetoresistive element 22.

Thus, the write operation for data "0" ends.

Subsequently, between time T30 and time T40, write of data "1" is executed. The magnetoresistive element 22 is kept in the P state until time T30.

At time T30, the controller 17 applies the voltage VddWA to the first write driver 30 and the second write driver 40. Then, a current Ip2ap flows through the magnetoresistive element 22.

For the currents Ip2ap and Ip2p flowing through the magnetoresistive element 22 having the same resistance value R_MTJp, the current Ip2p is smaller than the current Ip2ap. This is because the voltage VddWP applied to allow the current Ip2p to flow is lower than the voltage VddWA applied to allow the current Ip2ap to flow.

At time T35, the current Ip2ap causes magnetic reversal to change the magnetoresistive element 22 from the P state to the AP state, with data "1" written to the magnetoresistive element 22. As a result, in the magnetoresistive element 22, the resistance value changes from R_MTJp to R_MTJap, and the flowing current changes from Ip2ap to Iap2ap.

For the currents Iap2p and Iap2ap flowing through the magnetoresistive element 22 having the same resistance value R_MTJap, the current Iap2p is smaller than the current Iap2ap. This is because the voltage VddWP applied to allow the current Iap2p to flow is lower than the voltage VddWA applied to allow the current Iap2ap to flow.

The voltage VddWA is set so as to prevent the current Ip2ap (and Iap2ap) from being excessively large compared to a current Ic1 needed to cause magnetic reversal to change the magnetoresistive element 22 from the P state to the AP state.

At time T40, the controller 17 grounds the first write driver 30 and the second write driver 40. Then, no current flows through the magnetoresistive element 22.

Thus, the write operation for data "1" ends.

1.3 Effects of the Present Embodiment

A technique is known in which the magnetization orientation in the storage layer is reversed by passing a current with a predetermined magnitude through the magnetoresistive element. To allow the magnetization orientation to be reliably reversed, the write current actually flowing through the magnetoresistive element is set to a large value compared to a current needed to reverse the magnetization orientation.

On the other hand, a phenomenon is known in which when an excessively large write current is passed through the magnetoresistive element compared to a current which allows the magnetization orientation to be reversed, the magnetization returns, after reversal, to a direction antiparallel to the intended direction. Such a phenomenon is also referred to as a back hopping effect and may cause write errors. A larger current than necessary is not preferable in view of the need to reduce power consumption. Thus, the write voltage needs to be set so as to reliably reverse the magnetization orientation while preventing flow of excess current.

However, in general, the magnitude of a current needed to reverse the magnetization orientation varies between the write of data "1" (current Ic1) and the write of data "0" (current Ic0). In general, the same write voltage is used for the write of data "1" and for the write of data "0". Thus, a write voltage which allows flow of a current with the appropriate magnitude for one of the data write operations may cause, in the other data write operations, flow of an excess current enough to cause back hopping. More specifically, in the write operation involving reversal of the magnetization orientation in the storage layer 23 in the magnetoresistive element 22 in the low resistance state, an excess current may be passed by a write voltage which allows flow of a current (>current Ic0) with a magnitude enough to reverse the magnetization orientation in the storage layer 23 in the magnetoresistive element 22 in the high resistance state. As described above, both data write operations have room of examination in view of flow of a current with the appropriate magnitude through the magnetoresistive element.

In the first embodiment, the voltage generator 50 generates the voltage VddWP, supplied to the first write driver 30, and the VddWA, supplied to the second write driver 40, independently of each other. Consequently, the voltage VddWP is supplied to the first write driver 30 in the write operation for data "0". The voltage VddWA is supplied to the second write driver 40 in the write operation for data "1". Thus, the voltage generator 50 allows independent control of the current flowing through the magnetoresistive element 22 in the write operation for data "0" and the current flowing through the magnetoresistive element 22 in the write operation for data "1". Therefore, possible write errors caused by back hopping can be suppressed, and thus, reliability of the magnetic storage device 1 during data write can be enhanced. More specific reasons are as follows.

In both write operations for data "0" and data "1", a current flowing after the reversal of the magnetization orientation may cause back hopping. The current flowing during the write of data "0" increases after the reversal of the magnetization orientation. The current flowing during the write of data "1" decreases after the reversal of the magnetization orientation. Thus, in the write operation for data "1", the current flowing after the reversal of the magnetization orientation is only insignificantly different from the current Ic1 needed to reverse the magnetization orientation. In the write operation for data "0", the current flowing after the reversal of the magnetization orientation is significantly different from the current Ic0 needed to reverse the magnetization orientation. Consequently, back hopping is more likely to occur in the write operation for data "0" than in the write operation for data "1". Therefore, in order to suppress the back hopping effect, the current flowing during the write of data "0" needs to be kept smaller than the current flowing during the write of data "1". However, in general, the same write voltage is used for the write of data "1" and for the write of data "0". In this case, the current flowing through the magnetoresistive element 22 in the AP state has the same magnitude during the write operation for data "0" and during the write operation for "1". In a first aspect of the first embodiment, the VddWP is set lower than the VddWA. Then, the current flowing through the magnetoresistive element 22 in the AP state during the write operation for data "0" is smaller than in the case where the same voltage is used for the write operation for data "0" and for the write operation for data "1". As a result, for the current Iap2$p$ and the current Iap2$ap$, the current Iap2$p$ can be made smaller than the current Iap2$ap$, and thus, the current Ip2$p$ can also be reduced. Therefore, write errors caused by back hopping can be efficiently suppressed, thus allowing enhancement of reliability of the magnetic storage device 1 during data write.

In a second aspect of the first embodiment, the controller 17 varies the voltage VddWP and the voltage VddWA according to the temperature. Consequently, when the resistance values for the current path during the write of data "0" or data "1" have temperature coefficients, the value of the appropriate current to be supplied to the magnetoresistive element 22 can be kept optimal regardless of the temperature. Therefore, reliability of the magnetic storage device 1 during data write can be enhanced.

Specifically, the combined resistance value R_wpath_ap has a strong negative correlation with a variation in temperature. This is because the temperature coefficient of the resistance value R_MTJap, which is a dominant component of the combined resistance value R_wpath_ap, has a strong negative correlation. Thus, in the second aspect of the first embodiment, the voltage VddWP is allowed to exhibit a strong negative correlation with a variation in temperature. Consequently, the temperature coefficient of the voltage VddWP can be associated with the temperature coefficient of the combined. resistance value R_wpath_ap, allowing the value of the write current for data "0" to be kept optimal regardless of a variation in temperature.

The combined resistance value R_wpath_p may be considered to have a positive correlation or no correlation with a variation. in temperature. This is because the temperature coefficient of the resistance value R_MTJp, which is a dominant component of the combined resistance value R_wpath_p, may be considered to exhibit a weak positive correlation or no correlation with a variation in temperature. Thus, in the second aspect of the first embodiment, the voltage VddWA is allowed to exhibit a weak positive correlation or no correlation with a variation in temperature. Consequently, the temperature coefficient of the voltage VddWA can be associated with the temperature coefficient of the combined resistance value R_wpath_p, allowing the value of the write current for data "1" to be kept optimal regardless of a variation in temperature.

The amount of variation in combined resistance value R_wpath_ap with respect to the temperature has a larger absolute value than the amount of variation in the amount of variation in combined resistance value R_wpath_p with respect to the temperature. Thus, in the second aspect of the first embodiment, the amount of variation in voltage VddWP with respect to the temperature is set to have a larger absolute value than the amount of variation in voltage VddWA with respect. to the temperature. Consequently, the temperature coefficient relation between the voltage VddWP and the voltage VddWA can be associated with the temperature coefficient relation between the combined resistance value R_wpath_ap and the combined resistance value R_wpath_p.

2. Second Embodiment

Now, a magnetic-storage device according to a second embodiment will be described. The magnetic storage device according to the second embodiment is different from the magnetic storage device according to the first embodiment in the number of types of voltages supplied to the first write driver and the second write driver. Specifically, the first write driver and the second write driver in the magnetic storage device according to the first embodiment are driven by the two types of voltages, VddWA and VddWP. In contrast, the first write driver and the second write driver in the magnetic storage device according to the second embodiment are driven by three types of voltages, VddWA, VddWP, and Vdd. Components of the second embodiment similar to the corresponding components of the first embodiment are denoted by the same reference numerals and will not be described below. Only differences from the first embodiment will be described.

2.1 Configuration

A configuration of the magnetic storage device according to the second embodiment will be described.

2.1.1 Configuration of the Write Drivers

A configuration of the write drivers in the magnetic storage device according to the second embodiment will be described. FIG. 17 is a circuit diagram showing couplings to write drivers, a current sink, and a memory cell array in the magnetic storage device according to the second embodiment.

As shown in FIG. 17, a first write driver 30A and a current sink 12 are electrically coupled to a first terminal of a memory cell array 11 via bit lines BL. A second write driver 40A and the current sink 12 are electrically coupled to a second terminal of the memory cell array 11 via source lines/BL. The first and second write drivers 30A and 40A have configurations similar to the configurations of the first and second write drivers 30 and 40.

The signal ENP0 is input to a gate of each transistor 31. A voltage Vdd is supplied to a back gate of the transistor 31. The voltage VddWP is supplied to a first terminal of the transistor 31. A second terminal of the transistor 31 is connected to the corresponding bit line BL.

The signal ENP1 is input to a gate of each transistor 41. The voltage VddWA is supplied to a back gate of the transistor 41. The voltage VddWA is supplied to a first terminal of the transistor 41. A second terminal of the transistor 41 is connected to the corresponding source line/BL.

The voltage Vdd is, for example, a power supply voltage received from outside and is, for example, approximately 1.8 V. The voltage Vdd is higher than the voltages VddWA and VddWP. In this case, the voltages VddWA and VddWP are, for example, approximately 1.5 V and 1.2 V, respectively. The above-described values of the voltages Vdd, VddWA, and VddWP are illustrative. The voltages Vdd, VddWA, and VddWP may have any values so long as the voltages meet a magnitude relation Vdd>VddWA>VddWP.

The voltages, Vdd, VddWA, and VddWP and the signals ENP0, ENP1, ENN0, ENN1, and PR are generated by a controller 18A and output to the first write driver 30A or the second write driver 40A. The above-described configuration allows the voltages VddWP and Vdd to be supplied to the write driver 30A, and allows the voltages VddWA and Vdd to be supplied to the write driver 40A.

2.1.2 Configuration of the Controller

Figure 18:
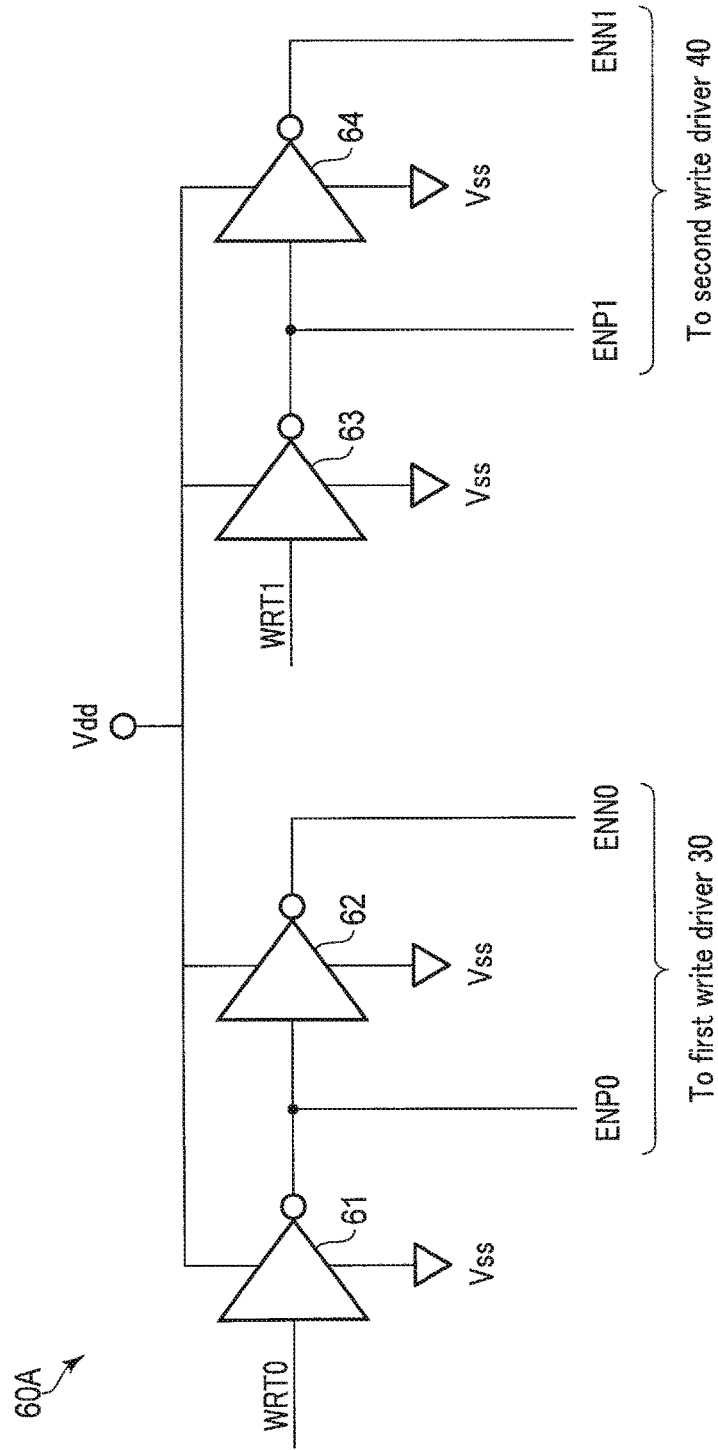
FIG. 18 is a circuit diagram showing a configuration of a signal generator in a controller in the magnetic storage device according to the second embodiment.

Now, a configuration of a controller in the magnetic storage device according to the second embodiment will be described below. FIG. 18 is a circuit diagram showing a configuration of a signal generator in the magnetic storage device according to the second embodiment. As shown in FIG. 18 signal generator 60A includes inverters 61 to 64 similarly to the signal generator 60. Each of the inverters 61 to 64 are driven using the voltage Vdd as a drive voltage. That is, the inverters 61 to 64 output an "H" level signal for the magnitude of the voltage VddWA.

2.2 Effects of the Present Embodiment

The voltage Vdd is received from outside and used as a power supply voltage in the magnetic storage device. Thus, the voltage Vdd may have an excessively larger value than the voltage to be supplied to the write drivers during data write. In the second embodiment, the voltages VddWP and VddWA are set to have smaller values than the voltage Vdd. Consequently, the voltages VddWP and VddWA can be generated independently of the voltage Vdd. Thus, the controller 17 can supply the voltages VddWP and VddWA with the appropriate magnitudes for the first write driver 30A and the second write driver 40A regardless of the value of the voltage Vdd. Therefore, reliability of the magnetic storage device 1 during data write can further be enhanced.

The second embodiment can also produce effects similar to the effects of the first embodiment and the first and second aspects of the first embodiment.

3. Third Embodiment

Now, a magnetic storage device according to a third embodiment will be described. The magnetic storage device according to the third embodiment is different from the magnetic storage devices according to the first and second embodiments in that the transistors 31 and 41 have different gate sizes. Components of the third embodiment similar to the corresponding components of the first embodiment are denoted by the same reference numerals and will not be described below. Only differences from the first embodiment will be described.

3.1 Configuration

A configuration of the magnetic storage device according to the third embodiment will be described below.

3.1.1 Configuration of the Write Drivers

Figure 19:
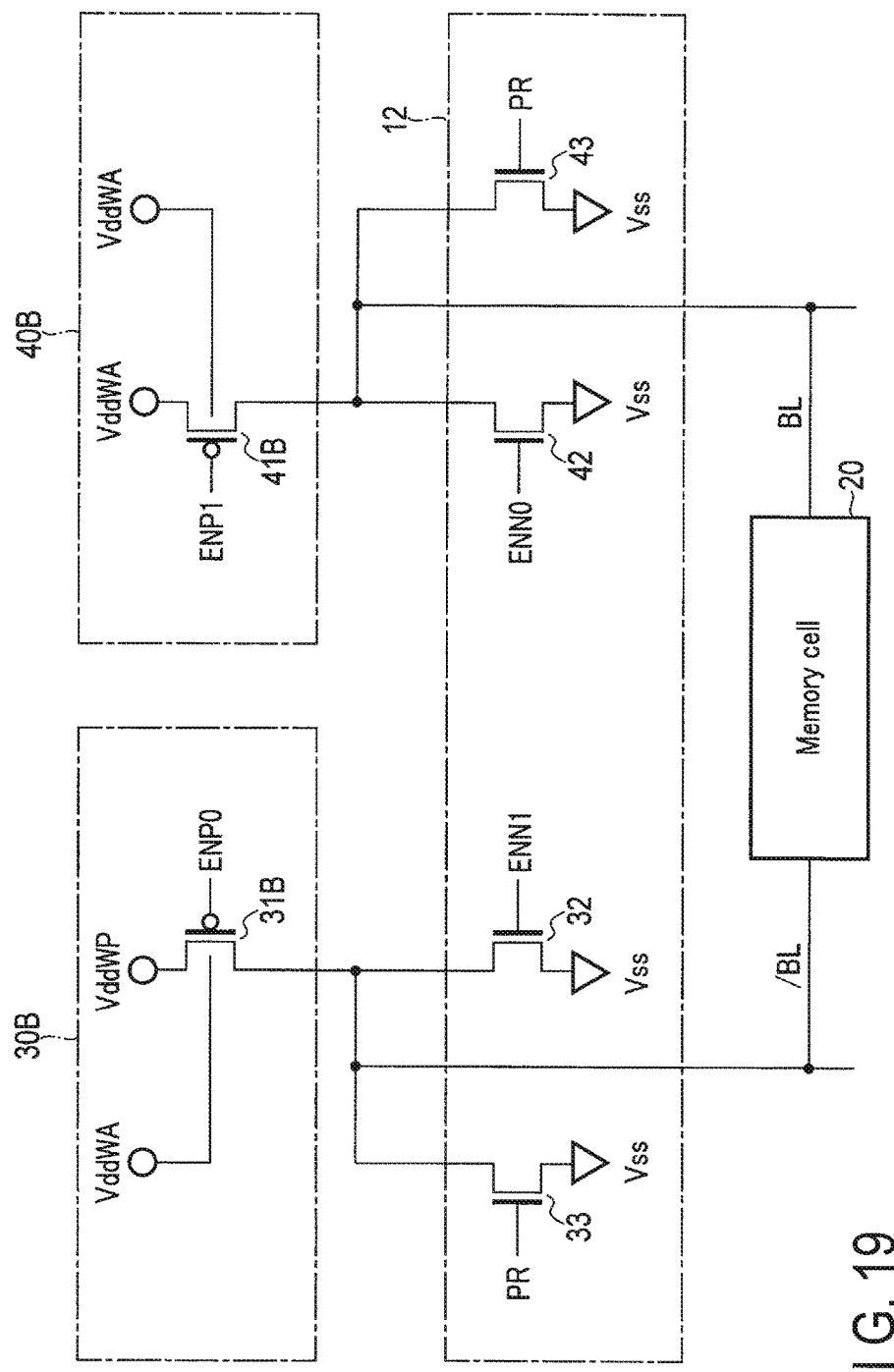
FIG. 19 is a circuit diagram showing couplings to write drivers, a current sink, and a memory cell array in a magnetic storage device according to a third embodiment.

Now, a configuration of write drivers in the magnetic storage device according to the third embodiment will be described. FIG. 19 is a circuit diagram showing couplings to write drivers, a current sink, and a memory cell array in the magnetic storage device according to the third embodiment.

As shown in FIG, 19, a first write driver 30B and a current sink 12 are electrically coupled to a first terminal of a memory cell 20 via bit lines BL. A second write driver 40B and the current sink 12 are electrically coupled to a second terminal of the memory cell 20 via source lines/BL. The first write driver 30B includes p-channel MOS transistors 31B instead of the transistors 31. The second write driver 40B includes p-channel MOS transistors 41B instead of the transistors 41.

The signal ENP0 is input to a gate of each transistor 31B. The voltage VddWA is supplied to a back gate of the transistor 31B. The voltage VddWP is supplied to a first terminal of the transistor 31B. A second terminal of the transistor 31B is connected to the corresponding bit line BL.

The signal ENP1 is input to a gate of each transistor 41B. The voltage VddWA is supplied to a back gate of the transistor 41B. The voltage VddWA is supplied to a first terminal of the transistor 41B. A second terminal of the transistor 41B is connected to the corresponding source line /BL.

The transistors 31B and 41B have different gate sizes. Specifically, the ratio W31/L31 of a gate width W31 to a gate length L31 of the transistor 31B is lower than the ratio W41/L41 of a gate width W41 to a gate length L41 of the transistor 41B. Consequently, even when the same voltage is applied to the gate, back gate, and source of each of the transistors 31B and 41B, a current flowing through a drain of the transistor 31B has a smaller value than a current flowing through a drain of the transistor 41B.

3.2 Effects of the Present Embodiment

The magnitude of a current (drain current) flowing between the source and drain of a transistor depends on the size of the transistor. Specifically, for example, the drain current is proportional to the gate width of the transistor and is inversely proportional to the gate length of the transistor.

In the third embodiment, the transistor 31B has a smaller gate size than the transistor 41B. Consequently, when the same voltage is supplied to one terminal of each of the transistor 31B and the transistor 41B, the current flowing through the transistor 31B can have a smaller value than the current flowing through the transistor 41B. Thus, the current flowing through the first write driver 30 can be kept smaller than the current flowing through the first write driver in the magnetic storage device according to the first embodiment. Therefore, reliability of the magnetic storage device 1 during data write can further be enhanced.

The third embodiment can also produce effects similar to the effects of the first embodiment and the first and second aspects of the first embodiment.

4. Modifications and the Like

The embodiments are not limited to the forms described above in the embodiments, and various modifications may be made to the forms. For example, the magnetic storage device 1 may measure the temperature of any of the memory cells 20 to feed information indicative of the measured temperature back for generation of the voltages VddWA and VddWP. Components of modifications described below which are similar to the corresponding components of the first embodiment are denoted by the same reference numerals and will not be described below. Only differences from the first embodiment will be described.

Figure 20:
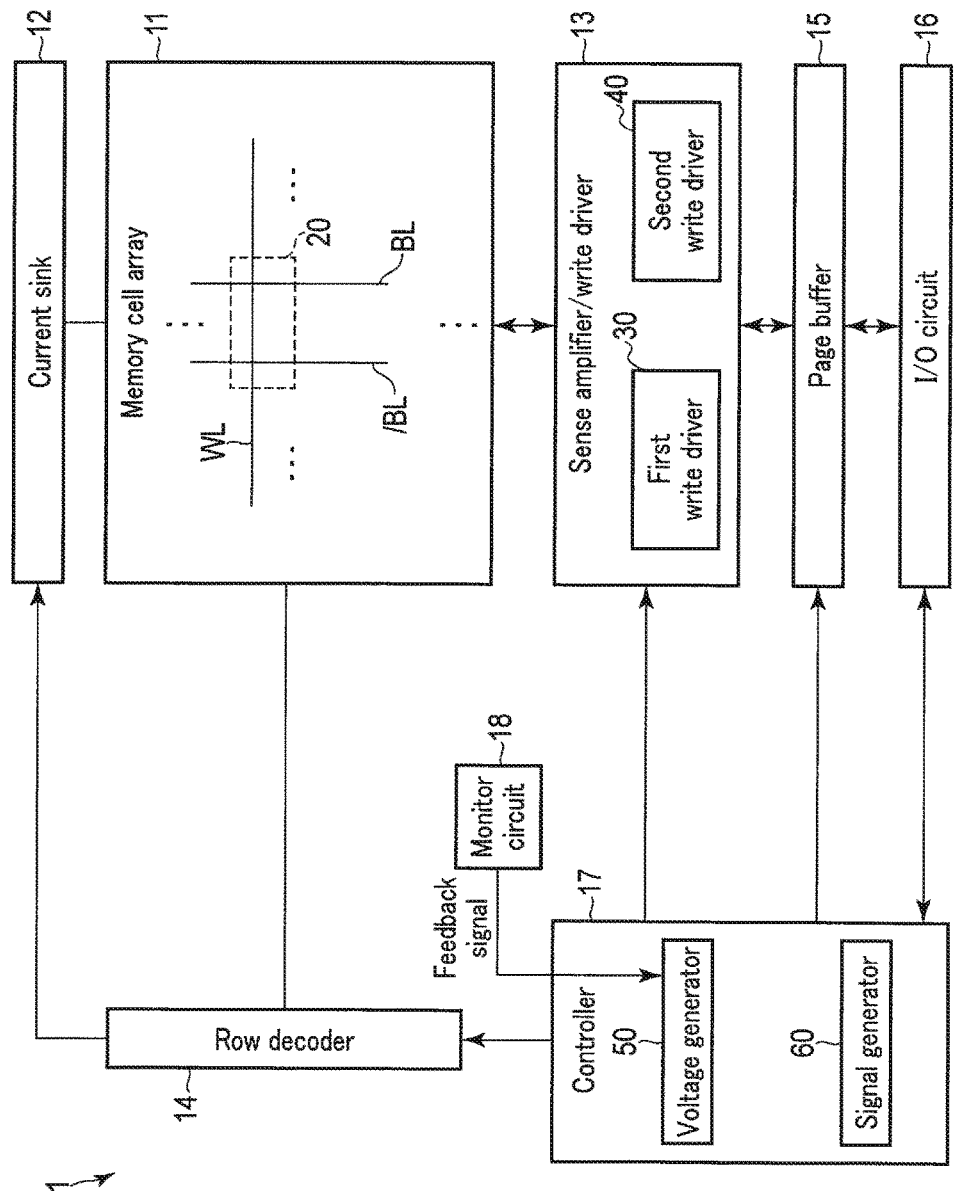
FIG. 20 is a block diagram showing a configuration of a magnetic storage device according to a first variation and a second variation.

FIG. 20 is a block diagram showing a configuration of a magnetic storage device according to a first variation and a second variation. As shown in FIG. 20, the magnetic storage device 1 may further comprise, for example, a monitor circuit 18.

The monitor circuit 18 includes, for example, a temperature sensor (not shown in the drawings) to measure the temperature of any of the memory cells 20. The monitor circuit 18 transmits feedback signal including information indicative of the temperature of the measured memory cell 20 to the voltage generator 50 in the controller 17.

Upon receiving the feedback signal, the voltage generator 50 according to the first modification, the voltage generator 50 generates voltages VddWA and VddWP based on the information included in the feedback signal and indicating the temperature of the memory cell 20.

In the above-described first modification, the magnetic storage device 1 allows the temperature of the memory cell 20 to be directly measured. Consequently, compared to a case where the voltages VddWA and VddWP are generated by setting the temperature of a reference voltage generator 51 approximate to the temperature of the memory cell 20, the first modification allows more optimal voltages VddWA and VddWP to be generated.

The monitor circuit 18 according to the second modification may include replica memory cells (not shown in the drawings). The monitor circuit 18 may monitor a temperature coefficient of any of the replica memory cells to detect a change in the temperature coefficient of the replica monitor cell resulting from aging deterioration. The monitor circuit 18 transmits feedback signal including information indicative of a detected change in temperature coefficient to the voltage generator 50 in the controller 17. The monitor circuit 18 as described above may be provided not only at location as shown in FIG. 20 but also at any other location in the magnetic storage device. For example, the monitor circuit 18 may be provided in the controller 17 or the memory cell array 11.

Upon receiving feedback signal, the voltage generator 50 according to the second modification generates voltages VddWA and VddWP based on information indicative of a change in temperature coefficient.

In the above-described second modification, the magnetic storage device 1 can detect a change in the temperature coefficient of the memory cell 20 resulting from aging degradation. Thus, compared to a case where the voltages VddWA and VddWP are generated in accordance with a preset the temperature coefficient, the second modification can generate voltages VddWA and VddWP using the appropriate temperature coefficient.

The magnetic storage device 1 in each of the above-described embodiments generates voltages VddWA and VddWP with the temperature coefficient taken into account by way of example. However, the temperature coefficient need not necessarily be considered. In this case, in the magnetic storage device 1 according to the third embodiment, the voltages VddWA and VddWP supplied to the first write driver 30 and the second write driver 40 may have an equal value.

The magnetoresistive element 22 described in each of the embodiments is a perpendicular magnetic MTJ element. However, the magnetoresistive element 22 is not limited to this, and may be a horizontal magnetic MTJ element having horizontal magnetic anisotropy.

The magnetoresistive element 22 in each of the above-described embodiments is of a bottom free type in which the storage layer 23 is provided on a semiconductor substrate side with the reference layer 25 laminated over the storage layer 23. However, the magnetoresistive element 22 may be of a top free type in which the reference layer 25 is provided on the semiconductor substrate side with the storage layer 23 laminated over the reference layer 25.

In each of the embodiments, MRAM including magnetoresistive elements has been described as an example of the semiconductor storage device. However, the semiconductor storage device is not limited to this. For example, the present invention is applicable to semiconductor storage devices having elements which store data utilizing resistance changes as in resistive memory similar to MRAM, for example, ReRAM or PCRAM.

The present invention is also applicable to semiconductor storage devices having elements which allow (i) storage of data based on a resistance change resulting from application of a current or a voltage or (ii) reading of stored data by converting a resistance difference resulting from a resistance change into a current difference or a voltage difference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

What is claimed is:

1. A magnetic storage device comprising:
   a memory cell including a magnetoresistive effect element, the magnetoresistive effect element including a storage layer and a reference layer;
   a first line electrically coupled to a first terminal of the magnetoresistive effect element;
   a second line electrically coupled to a second terminal of the magnetoresistive effect element;
   a temperature detection element configured to detect a temperature;
   a write driver; and
   a voltage generator,
   wherein the voltage generator generates a first voltage, and varies the generated first voltage according to the temperature, wherein the write driver supplies the varied first voltage to the first line in a first write operation in which a first resistance value of the magnetoresistive effect element is changed to a second resistance value smaller than the first resistance value, and wherein the voltage generator is configured such that the generated first voltage has a negative correlation with the temperature.

2. The device of claim 1, wherein the voltage generator generates a second voltage, and the second voltage is uncorrelated with the temperature, and wherein the write driver supplies the second voltage different from the first voltage to the second line in a second write operation in which the second resistance value of the magnetoresistive effect element is changed to the first resistance value.

3. The device of claim 1, wherein the voltage generator generates a second voltage, and varies the generated second voltage according to the temperature, wherein the write driver supplies the varied second voltage different from the first voltage to the second line in a second write operation in which the second resistance value of the magnetoresistive effect element is changed to the first resistance value.

4. The device of claim 3, wherein the second voltage has a positive correlation with the temperature.

5. The device of claim 4, wherein an amount of variation in the first voltage with respect to the temperature has a larger absolute value than an amount of variation in the second voltage with respect to the temperature.

6. The device of claim 3, wherein an amount of variation in the second voltage with respect to the temperature is larger than an amount of variation in the first voltage with respect to the temperature.

7. The device of claim 3, wherein the first voltage is lower than the second voltage.

8. The device of claim 7, wherein the second voltage is lower than a power supply voltage.

9. The device of claim 3, wherein the write driver includes:

a first transistor having a first terminal electrically coupled to the first line and a second terminal electrically coupled to the first voltage, the first transistor being set to an on state in the first write operation to supply the first voltage to the first line and being set to an off state in the second write operation, and a second transistor having a first terminal electrically coupled to the second line and a second terminal electrically coupled to the second voltage, the second transistor being set to the on state in the second write operation to supply the second voltage to the second line and being set to the off state in the first write operation.

10. The device of claim 9, wherein the first transistor has a smaller gate size than the second transistor.

11. The device of claim 10, wherein the first voltage is equal to or lower than the second voltage.

* * * * *